(12) United States Patent
Rinaldi et al.

(10) Patent No.: US 11,329,355 B2
(45) Date of Patent: May 10, 2022

(54) RECONFIGURABLE FILTER BASED ON COMMUTATION OF SINGLE FREQUENCY RESONATORS

(71) Applicant: Northeastern University, Boston, MA (US)

(72) Inventors: Matteo Rinaldi, Boston, MA (US); Giuseppe Michetti, Somerville, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 17/131,964

(22) Filed: Dec. 23, 2020

(65) Prior Publication Data

US 2021/0203049 A1 Jul. 1, 2021

Related U.S. Application Data

(60) Provisional application No. 62/954,065, filed on Dec. 27, 2019.

(51) Int. Cl.
| | |
|---|---|
| *H01P 1/20* | (2006.01) |
| *H01P 1/205* | (2006.01) |
| *H03H 9/54* | (2006.01) |
| *H04B 1/7093* | (2011.01) |
| *H01P 7/06* | (2006.01) |

(52) U.S. Cl.
CPC .............. *H01P 1/2053* (2013.01); *H01P 7/06* (2013.01); *H03H 9/542* (2013.01); *H04B 1/7093* (2013.01); *H04B 2001/70935* (2013.01)

(58) Field of Classification Search
CPC .. H01P 1/20; H01P 1/201; H01P 1/203; H01P 7/08; H01P 7/082; H01P 7/01; H01P 7/0107; H03H 11/04; H03H 11/0405; H03H 11/00; H03H 11/36; H03H 11/365; H03H 15/00; H03H 2015/026; H03H 19/00; H03H 19/002; H03H 19/008; H03H 9/542; H03H 9/54; H03H 9/545; H04B 1/7093; H04B 2001/70935
See application file for complete search history.

(56) References Cited

U.S. PATENT DOCUMENTS

| | | | | |
|---|---|---|---|---|
| 5,491,453 | A * | 2/1996 | Ichihara | H03H 19/002 327/45 |
| 11,205,826 | B2 * | 12/2021 | Nagulu | H01P 1/38 |
| 2009/0072927 | A1 * | 3/2009 | Rhodes | H01P 1/20 333/202 |

(Continued)

OTHER PUBLICATIONS

Cassella el al., "Cross-sectional Lamé mode ladder filters for UHF wideband applications," IEEE Electron Device Letters, vol. 37, No. 5, 3 pages, 2016.

(Continued)

*Primary Examiner* — Stephen E. Jones
(74) *Attorney, Agent, or Firm* — Verrill Dana, LLP

(57) ABSTRACT

Adaptive RF filters based on modulated resonators are provided. The filter architecture is based on time-interleaved commutation of passive RF resonators. The architecture can behave as a two-port filter network, with a fully tunable instantaneous filter bandwidth. The filters are applicable as miniaturized, environment-aware RF signal processing components and can be used in mobile communications.

20 Claims, 27 Drawing Sheets

(56) References Cited

U.S. PATENT DOCUMENTS

2018/0138889 A1  5/2018  Rinaldi et al.
2019/0334568 A1* 10/2019  Gong ................... H03K 5/14

OTHER PUBLICATIONS

Cassella el al., "Radio Frequency Angular Momentum Biased Quasi-LTI Nonreciprocal Acoustic Filters," IEEE Trans. Ultrason., Ferroelectr., Freq. Control, pp. 1814-1825, 2019. DOI: 10.1109/TUFFC.2019. 2931121.

Cassella et al., "Rf passive components based on aluminum nitride cross-sectional lamé-mode mems resonators," IEEE Transactions on Electron Devices, vol. 64, No. 1, pp. 237-243, 2017.

Cassella et al., "Ultra-high Isolation Nonreciprocal Acoustic Filters," in 2019 IEEE MTT-S International Microwave Symposium (IMS), pp. 524-527, Jun. 2019.

Chen et al., "Single-chip multi-frequency wideband filters based on aluminum nitride cross-sectional Lamé mode resonators with thick and apodized electrodes," in 2018 IEEE Micro Electro Mechanical Systems (MEMS), 2018, pp. 775-778.

Ghaffari et al., "Tunable High-Q N-Path Band-Pass Filters: Modeling and Verification," IEEE Journal of Solid-State Circuits, vol. 46, No. 5, pp. 998-1010, 2011.

Klumperink et al., "N-path filters and mixer-first receivers: A review," in 2017 IEEE Custom Integrated Circuits Conference (CICC), vol. 2017-, pp. 1-8, IEEE, 2017.

Michetti et al., "A Quasi-LTI Frequency-Selective SAW Circulator," in 2018 IEEE International Ultrasonics Symposium (IUS), Oct. 2018, 4 pages. DOI: 10.1109/ULTSYM.2018.8579721.

Piazza et al., "Single-Chip Multiple-Frequency ALN MEMS Filters Based on Contour-Mode Piezoelectric Resonators," Journal of Microelectromechanical Systems, vol. 16, No. 2, pp. 319-328, 2007, ISSN: 1057¬7157. DOI: 10.1109/JMEMS.2006.889503.

Pirro et al., "Novel Topology for a Non-Reciprocal MEMS Filter," in 2018 IEEE International Ultrasonics Symposium (IUS), Oct. 2018, 3 pages. DOI: 10.1109/ULTSYM.2018.8580092.

Tymchenko et al., "Quasielectrostatic Wave Propagation Beyond the Delay-Bandwidth Limit in Switched Networks," Phys. Rev. X, vol. 9, 16 pages, Jul. 3, 2019. DOI: 10.1103/PhysRevX.9.031015.

Yang et al., "4.5 GHz Lithium Niobate MEMS Filters With 10% Fractional Bandwidth for 5G Front-Ends," Journal of Microelectromechanical Systems, vol. 28, No. 4, pp. 575-577, Aug. 2019. DOI: 10.1109/JMEMS.2019.2922935.

Yu et al., "Highly-Linear Magnetic-Free Microelectromechanical Circulators," in Journal of Microelctromechanical Systems, vol. 28, No. 6, Dec. 2019, pp. 933-940.

Yu et al., "Radio Frequency Magnet-Free Circulators Based on Spatiotemporal Modulation of Surface Acoustic Wave Filters," IEEE Trans. Microw. Theory Techn., pp. 4773-4782, 2019. DOI: 10.1109/TMTT.2019.2943291.

Xu et al., "A Generalized Model for Linear-Periodically-Time-Variant Circulators," Scientific Reports, vol. 9, No. 1, pp. 1-16, 2019, ISSN: 2045¬2322. DOI: 10.1038/s41598-019-45013-5.

* cited by examiner (a) Charge phase        (b) Discharge phase

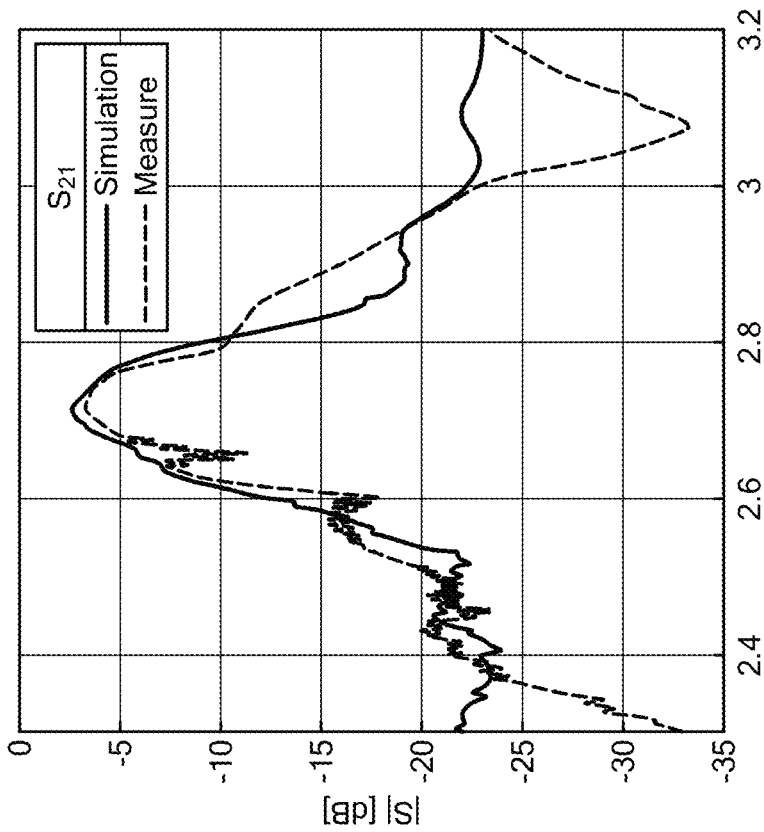
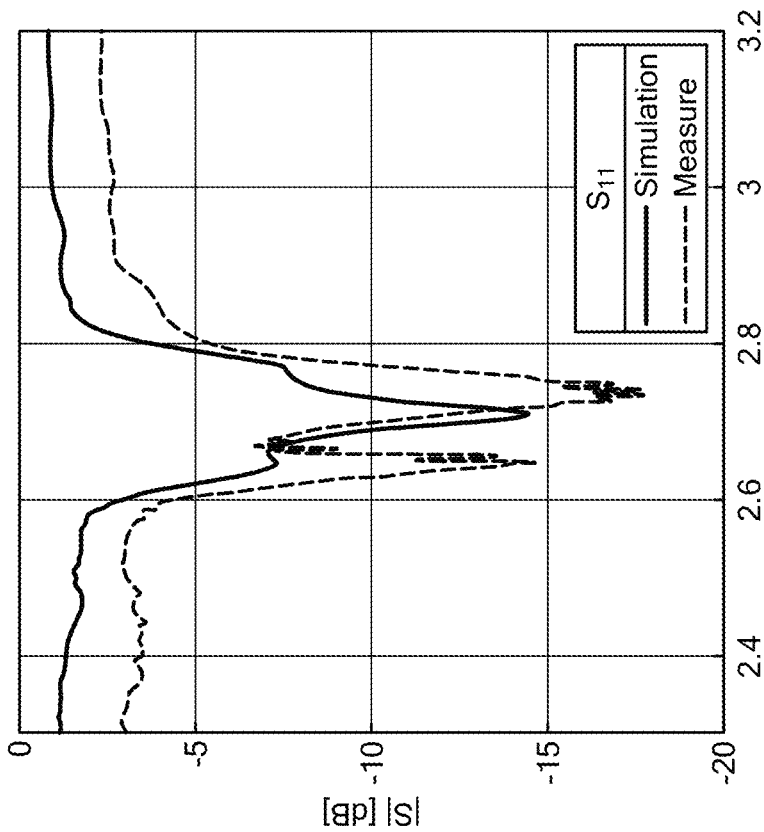
FIG. 17(a)
FIG. 17(b)

RECONFIGURABLE FILTER BASED ON COMMUTATION OF SINGLE FREQUENCY RESONATORS

CROSS REFERENCE TO RELATED APPLICATIONS

This application claims priority under 35 U.S.C. § 119(e) of U.S. Provisional Application No. 62/954,065, filed on 27 Dec. 2019, entitled "Reconfigurable Filter Based on Commutation of Single Frequency Resonators," the disclosure of which is hereby incorporated by reference.

STATEMENT REGARDING FEDERALLY SPONSORED RESEARCH OR DEVELOPMENT

This invention was made with government support under Grant No. HR0011-17-2-0002 awarded by DARPA. The government has certain rights in the invention.

BACKGROUND

The era of Very Large Scale Integration (VLSI) of electronic circuits has enabled a marketable technological platform to design chip-sized computer systems. Most of these systems are connected through over-the-air wireless Radio Frequencies (RF) communication; as a consequence, virtually every mobile system is equipped with RF processing hardware, such as receivers (RX) and transmitters (TX), as well as high-throughput digital data processors, integrated when possible within $mm^2$ of area of VLSI components.

Evolution trends in RF mobile architectures are mostly driven by larger data-rate requirements from the user end, driven by real-time applications such as high quality video streaming and video calls, ultimately enabling a series of interactive services based on real-time processed calculations, remotely prompted through RF channels so that the final user can have it available on a cellular device (paradigm known as cloud computing). As a result, more communication bands are constantly allocated and auctioned at higher RF carriers, so that greater availability of services and larger data rates can be processed on handheld transceivers. Following this path, the range of use of RF communications evolved from voice data exchange to high quality video streaming in real-time within two decades. This fast-paced advancement currently relies on architectural network strategies, as well as on the evolution of electronic devices for the first conditioning of RF signals, targeting smaller, cheaper, VLSI-compatible solutions across the different frequencies of operation, as they become available on the market.

SUMMARY

The technology described herein provides a fully programmable RF filter, with a large degree of freedom of center frequency and bandwidth, ultimately devising a real-time capability of RF spectrum monitoring in minimized footprint, complying with modern software-driven radio front-end architectures with minimal additional design effort. This component can enhance state-of-the-art RF filtering in next generation mobile radios, where low-power, adaptive, software-oriented communication protocols are to be implemented in chip-scaled systems.

In some embodiments, the technology provides a real-time reconfigurable MEMS filter microsystem that is able to exhibit bandpass (BP) or bandstop (BS) responses in the radio frequency (RF) spectrum. The unit cell of the reconfigurable filter can include a double-pole, double-throw (DPDT) switch periodically modulating two thin-film bulk-acoustic resonators (FBARs) on the same resonance frequency. Unlike traditional FBAR ladder filters which involve higher fabrication complexity for multi-frequency FBARs on the same chip, the technology herein provides a system to achieve a sharp BS filtering response by periodically commutating multiple identical FBARs. Due to the excellent spectral selectivity of those resonators, sharp notches can be obtained in the same frequency range by reconfiguring the commutation frequency. Experimental results demonstrate a 30 dB rejection in BS mode and a 2.5 dB insertion loss (IL) in BP mode, within a bandwidth set by the modulation frequency (up to 3.6% of the RF signal frequency). In BP mode, the filter can exhibit a more than 20 dB out-of-band rejection for a single stage.

In some embodiments, a filter device has at least two electromechanical resonators having a same resonant frequency, the resonators connected on parallel paths between an input port and an output port. On each path, a switch assembly includes a first switch of a pair of switches connected between the input port and the resonator and a second switch of the pair connected between the resonator and the output port. The switches are operable to be sequentially commutated at a modulation period and a duty cycle selected to provide a bandpass mode or a bandstop mode.

Further aspects of the technology include the following:
1. A filter device comprising:
    a substrate, an electrical input port and an electrical output port supported on the substrate;
    at least two resonators having a same resonant frequency, the resonators connected on parallel paths between the input port and the output port; and
    a plurality of switch elements comprising, on each path, a pair of switches, a first switch of the pair connected between the input port and the resonator and a second switch of the pair connected between the resonator and the output port, the switches operable to be sequentially commutated at a modulation period and a duty cycle selected to provide a bandpass mode or a bandstop mode.
2. The filter device of 1, wherein the switch elements are operable, in the bandpass mode, to charge each of the resonators from the input port and discharge each of the resonators to the output port.
3. The filter device of any of 1-2, wherein the switch elements are operable in a pattern of overlapping charging times and overlapping discharging times, or in a pattern of non-overlapping charging times and a pattern of non-overlapping charging times.
4. The filter device of any of 1-3, wherein the first switch is operable to turn on to charge the resonator from the input port, and after the first switch is turned off, the second switch is operable to turn on to discharge the resonator to the output port.
5. The filter device of any of 1-4, wherein, in the bandpass mode, an input signal from the input port is within a selected bandwidth of the resonant frequency, and in the bandstop mode, the input signal is outside of the selected bandwidth of the resonant frequency.
6. The filter device of any of 1-5, further comprising circuitry in communication with the plurality of switch elements to operate each of the switches at the selected modulation period and selected duty cycle.
7. The filter device of any of 1-6, wherein the switch assemblies are operable to reconfigure a center frequency of the filter device.

8. The filter device of any of 1-7, wherein each of the first switches is operable in an on state for a time proportional to a rise time of the resonators.

9. The filter device of any of 1-8, wherein the modulation period is proportional to a dominant time constant of the resonators, and the time constant is inversely proportional to the resonant frequency, a resonator capacitance, an electromechanical coupling coefficient of the resonators, and an impedance load at the input port.

10. The filter device of any of 1-9, wherein the duty cycle is selected based on a number of the resonators.

11. The filter device of any of 1-10, further comprising an inductor disposed in parallel with each of the resonators, and a further switch connected to the inductor and operable to turn the inductor on for operation in a bandstop mode.

12. The filter device of any of 1-11, wherein each resonator includes an electromechanical resonator or a resonant circuit.

13. The filter device of any of 1-12, wherein the resonant circuit includes a capacitor bank, back to back varactors, or reconfigurable resonators.

14. The filter device of any of 1-13, wherein each of the resonators comprises a thin-film piezoelectric resonator.

15. The filter device of any of 1-14, wherein each of the resonators comprises a thin-film bulk acoustic resonator, a cross-sectional Lame mode resonator, a contour mode resonator, a surface acoustic wave resonator, or a bulk acoustic wave resonator.

16. The filter device of any of 1-15, wherein each resonator comprises a piezoelectric layer, a first conductive material layer comprising at least a first electrode on a top surface of the piezoelectric layer, and a second conductive material layer comprising at least a second electrode on a bottom surface of the layer.

17. The filter device of any of 1-16, wherein the piezoelectric layer is a piezoelectric material selected from the group consisting of quartz, aluminum nitride, doped aluminum nitride, lithium niobate, lithium tantalite, zinc oxide, and gallium nitride.

18. The filter device of any of 1-17, wherein each switch assembly comprises a capacitor in parallel with a switch, an inductor in parallel with a switch, a single pole single throw switch, a single pole double throw switch, a double pole double throw switch, or a single pole N throw switch, where N is a number of the resonators.

19. A circuit device including the filter device of any of 1-18.

20. The circuit device of any of 1-19, further comprising a control unit in communication with the filter device, the control unit comprising a voltage controller or a digital decoder.

21. A radio transceiver including the filter device of any of 1-18.

22. A radio transceiver including the circuit device of any of 1-20.

23. A method of operating the filter device of any of 1-22, comprising operating the switch assemblies to actuate the resonators over time in the bandpass mode or the bandstop mode.

24. The method of 23, further comprising operating switch elements, in the bandpass mode, to charge each of the resonators from the input port and discharge each of the resonators to the output port.

25. The method of any of 23-24, further comprising operating the switch elements in a pattern of overlapping charging times and overlapping discharging times, or in a pattern of non-overlapping charging times and a pattern of non-overlapping charging times.

26. The method of any of 23-25, further comprising operating the first switch to turn on to charge the resonator from the input port, and after the first switch is turned off, operating the second switch is turn on to discharge the resonator to the output port.

27. The method of any of 23-26, further comprising operating the switch assemblies to reconfigure a center frequency of the filter device.

28. A method of filtering radio frequency (RF) signals input to a radio transceiver, comprising:
    providing the filter device or radio transceiver of any of 1-22; and
    operating the switch assemblies to actuate the resonators over time in the bandpass mode or the bandstop mode.

29. The method of 28, further comprising operating switch elements, in the bandpass mode, to charge each of the resonators from the input port and discharge each of the resonators to the output port.

30. The method of any of 28-29, further comprising operating the switch elements in a pattern of overlapping charging times and overlapping discharging times, or in a pattern of non-overlapping charging times and a pattern of non-overlapping charging times.

31. The method of any of 28-30, further comprising operating the first switch to turn on to charge the resonator from the input port, and after the first switch is turned off, operating the second switch is turn on to discharge the resonator to the output port.

32. The method of any of 28-31, further comprising operating the switch assemblies to reconfigure a center frequency of the filter device.

DESCRIPTION OF THE DRAWINGS

In FIG. 7(b) the sudden drop of fractional BW tuning is given by the in-band ripples that exceed the 3 dB threshold, overcoupling the filter poles for larger $f_m$.

In FIG. 8(a), a single DC control voltage $V_{DC}$ can be used to continuously adapt the filter $f_c$ by modulation of the capacitance of a back-to-back varactor configuration.

FIG. 16 illustrates measured S-parameters from the FIG. 15(a). Reconfiguration is evident in FIGS. 16(a)-16(b). When $F_m=50$ MHz to 90 MHz (equation), a BP response is induced. Vice-versa, when $F_m=100$ kHz, a notch is formed at the same frequency. In FIG. 16(c), 3 dB BW and group delay is plotted against $F_m$, confirming the simulated trends in FIG. 14(a).

FIGS. 17(a) and (b) illustrate a comparison between experimental and simulated results. A spurious peak, attributed to capacitive coupling between the two resonators, is observed in the $S_{11}$ response, while OBR is affected by switch and wire bonding parasitics.

DETAILED DESCRIPTION

1. Introduction 1.1 Towards Software Defined Specification for Hardware

Next generations of radios are concerned with RF spectrum crowdedness, as required data-rate and variety of applications are in constant expansion. As RF networks expand across number of users and standards, corresponding allocated bands are linearly increasing with time.

Figure 1A:
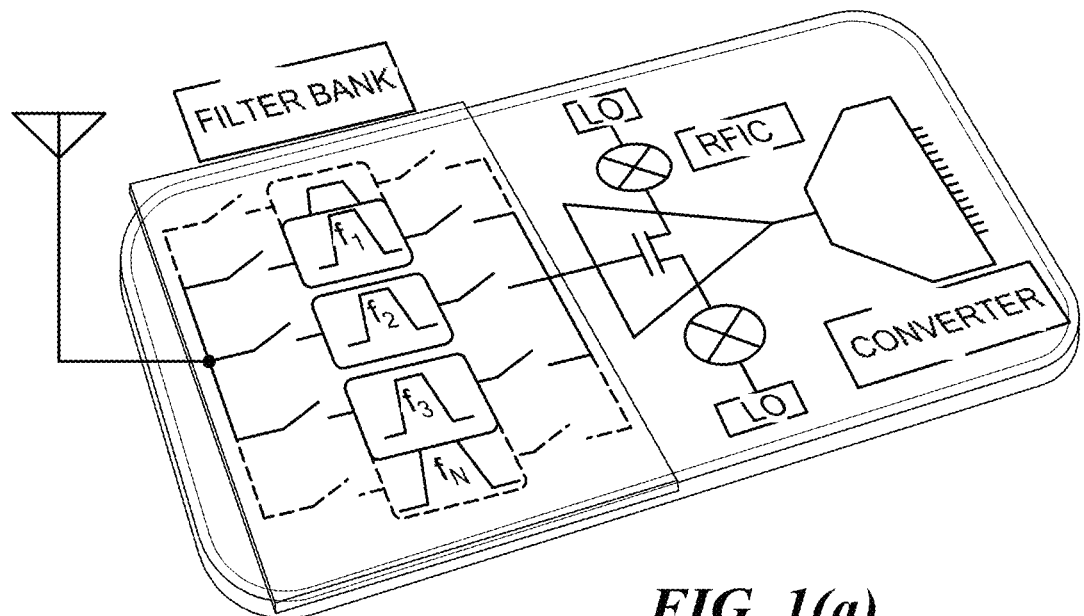
FIG. 1(a) is an overview of a state of the art modern antenna multiplexed filter for adaptive RF front-ends. This architecture represents a bottleneck for next generation radios, as switching between bands is achieved by multiplexing the input signal from the antenna through different physical filters. Both chip size and multiplexers design becomes critical as more and more bands have to be available to the network in limited footprint.

Mobile terminals can be represented at the antenna interface as shown in FIG. 1(a), with large area estate consumed by individual chips necessary to select the bands, properly multiplexed to the antenna and receiver. As these constraints constantly narrow down design space in mobile designs, a larger effort is required on the architecture side both to mitigate the medium scarcity and unavoidable neighboring interferers.

For these reasons, recent efforts have focused on radio paradigms and subsystems capable of mitigating the constraints posed by RF devices and channels, leveraging on the processing power available at the digital back-end of RF networks. RF channels, in fact, are not only susceptible to large interferers, but being operated on-air are subject to unpredictable changes according ambient morphology (reflections from different materials, obstacles and loss of line-of-sight both in open and closed environment) and weather conditions. RF devices instead typically suffer from parasitic effects that have increasingly detrimental effects as frequencies go up, and are usually ultimately limited by material properties such as mobility and power efficiency.

As an example, Cognitive Radios are specifically concerned with how to make mobile systems more aware of their environment, so to control in real-time transmitted power, RF carriers, data-rates and potentially standards-specific architectures. Driven by the capability of network designers to rely on very flexible electronic systems, run-time programmable architectures such as the popular Software Defined Radio, are redefining the operativity of radios towards increased levels of cooperation, enabled by software-defined reconfigurability of typical RF communication building blocks.

The evolution of mobile networks relies on seamless integration of software-driven decisions operations on analog RF components. A challenge associated with smart radios is the ability of their components to be equally smart, tunable in their performances and quickly responsive to digital controls, decided at run-time by digital software-defined controller.

Figure 1B:
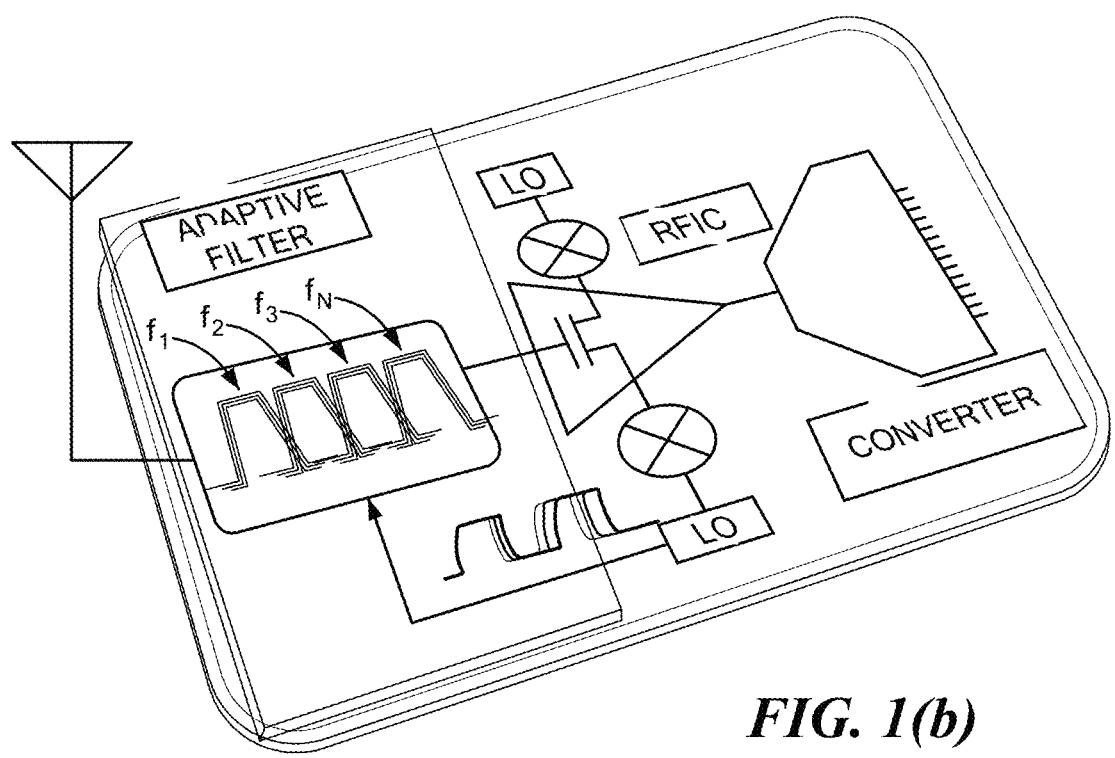
FIG. 1(b) illustrates a dynamic filter according to an embodiment of the technology described herein. The dynamically programmable RF filter can practically address the issue of FIG. 1(a), as it can reconfigure its center frequency with very simple and effective analog or digital control schemes, as discussed further herein. Moreover, it achieves extremely wide BW reconfigurability through its characteristic time interleaved dynamics, enabled through frequency-modulated square-wave digital signals, using on-chip functionality in RFIC chips. BW reconfiguration enables real-time adaptive communication, a useful feature for the emerging radio paradigm.

Accordingly, in such a scenario, the technology described herein provides a filter architecture that presents a greater level of reconfigurability at the circuit level, to provide an enhanced level of system awareness, relaxing at the same time the digital effort at the back-end. This strategy leverages spatio-temporal modulation to outperform the limited reconfigurability of center frequency $f_c$ and bandwidth BW (depicted in FIG. 1(b)) of conventional linear systems. Many benefits can be provided from such a structure in the RF domain, as area consumption is minimized for an increasing number of channels.

For example, design challenges associated with interconnections at higher radio/millimeter wave frequencies can be greatly relaxed. Tuning filter BW can be accommodated for the need of an environment-aware communication, where data rates can vary over time, and signal conditioning both in transmission (TX) and reception (RX) can be dynamically optimized to take into account the harshness of the channel for a given time, forming a closed-loop approach to robust RF adaptive communication. Additionally, monitoring signal bandwidths can allow further optimization of energy-limited radio applications, allowing for a better control of power lifetime of mobile systems. Introducing an efficient solution for $f_c$ reconfigurability allows the tracking of interferers, jammers and disruptive RF signals, which can further improve radio security and robustness, which is important in next generation mobile systems.

1.2 Challenges and Opportunities Related to Reconfigurable Filters

Making a large number of filters available on chip-sized transceivers can be done in microacoustic structures, layered on a thin film of piezoelectric materials compatible with silicon, and micromachined with Micro Electro Mechanical Systems (MEMS) techniques. Tuning of high quality factor (Q) piezoelectric resonators such as free-standing bulk acoustic resonators (FBARs) has also led to miniaturization trends for such RF components that would not scale accordingly to Moore's Law. The practical result has been the commercialization of multi-band radios within a handheld compatible footprint, enlarging the range of applications and bands for communications across different standards, carriers, and bandwidth requirements. Many different resonators are available mounted on RF chips, mainly in the form of duplexers, to boost signal-to-noise ratios (SNR) and to protect transceivers at their front-end.

The lack of adaptive passive front-end filter components based on piezoelectric technologies has shaped mobile radio architectures. Such architectures that are accessible to multiple bands currently rely on solid state switches, for the most part multiplexing in time the routing of RF signal though the large number of filters, and both time and frequency multiplexing architectures are relying on this analog system, at their back end.

Figure 11A:
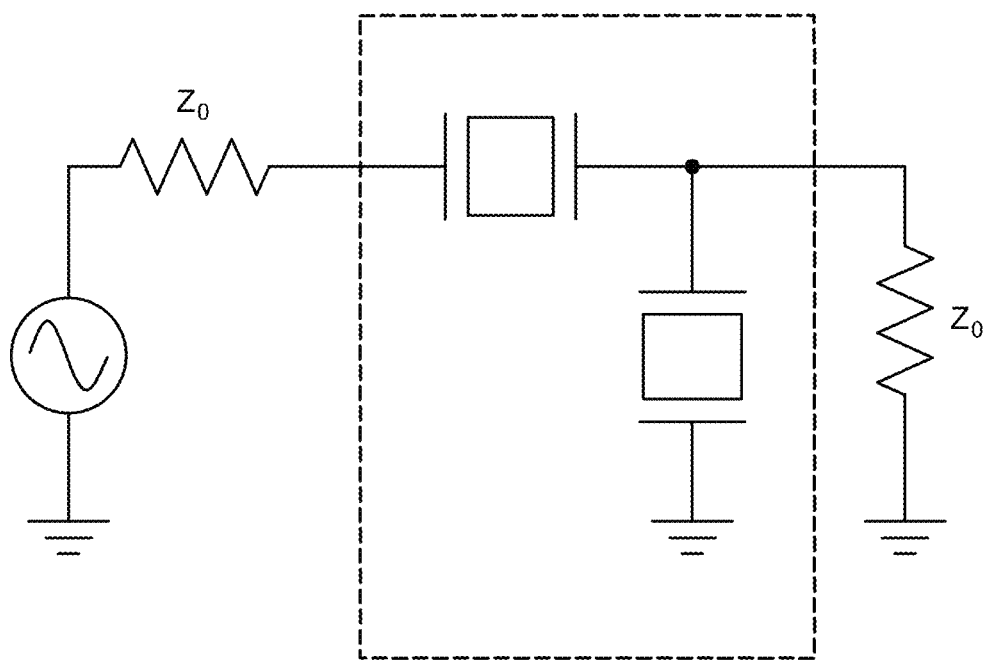
FIG. 11(a) illustrates a RF MEMS ladder BP filter topology and FIG. 11(b) illustrates a typical $S_{21}$ response and MEMS resonators impedances (Z). The MEMS resonance frequencies have to be detuned to obtain a BP response. Moreover, matching to $Z_0$ is obtained through proper sizing of the capacitance $C_0$ of the resonators.
Figure 11B:
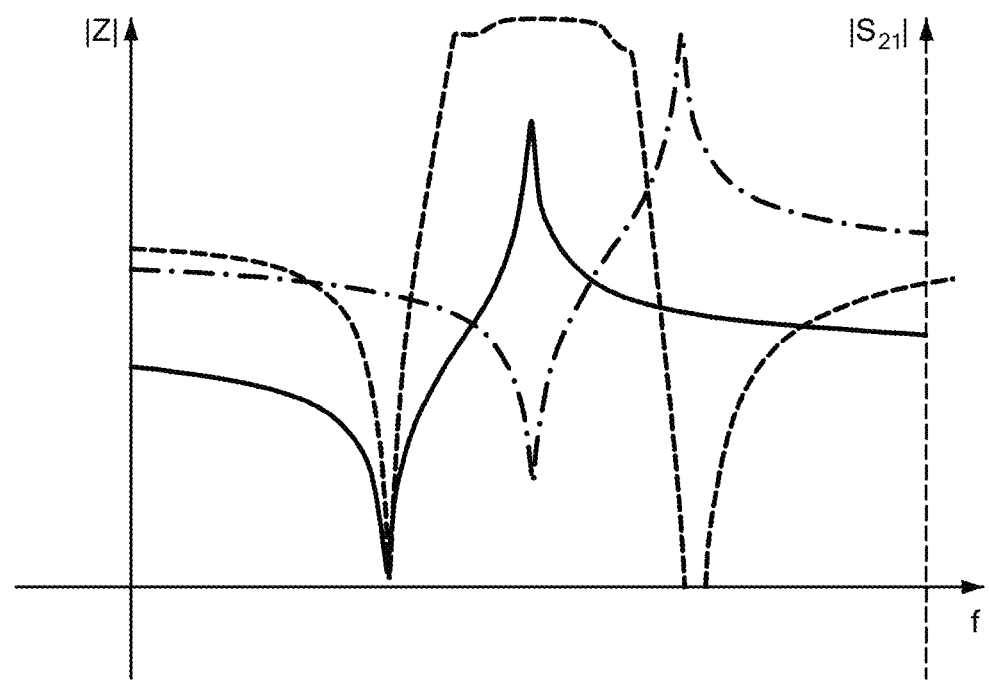

On the filter side, N filters require approximately 2N different resonance frequencies (using conventional ladder filter topologies, see, e.g., FIG. 11(a)) which results in significant costs for controlling fabrication steps and control of device trimming for mass-scale production. This has been already assessed as a bottleneck for microacoustic technologies going into novel mobile networks.

Conventional electrically tunable elements such as varactors typically degrade filter power handling and often result in increasingly complex modulation schemes required to control nonlinear elements. Modern tunable filter designs achieve $f_c$ tunability and BW relying on a number of DC control signals and chokes comparable to filter order, often resulting in complicated control schemes, eventually limiting performances and ease of implementation. Exploiting ferroelectric responses and nonlinear phenomena have shown promising results in the past, but whenever tunability is achieved, performance metrics such as Insertion Loss (IL) and maximum input power ($P_{1\ dB}$) are inherently degraded by control circuits, nonlinear element losses or lossy tuning schemes.

The technology described herein addresses these problems by introducing features to reconfigurable filters, introducing time-variant circuitry to provide efficient BW tuning mechanism, and by artificially coupling resonators through alternating switches, eases the control schemes required to tune the resonators $f_{res}$.

1.3 Sequentially-Switched Networks for RF Processing

As adaptive and programmable response becomes more important for RF hardware, techniques to process RF signals based on periodic and interleaved modulation of clocked switches may be used for boosting performances of more mature fully passive design approaches. A topology known as N-path filter provides the capability of exhibiting modulation-defined zeros/poles in its transfer function. Linear Periodically Time Variant (LPTV) can be used to obtain nonreciprocal response, often with improved performances or form factors. This filter fits into the category of LPTV networks, a relatively recent class of circuits and systems that has demonstrated advanced RF functionalities for chip-sized components such as nonreciprocal response and large on-chip delays, as well as filter reconfigurability.

Mostly because all of them rely on synchronized modulation, these networks are natively equipped with BW tuning functionalities without relying on nonlinearities to induce reconfigurability, as usually happens for Linear Time Invariant (LTI) systems. In particular, the filter linear response entirely relies on modulation defined poles. Its design relies solely on common building blocks and is therefore suitable for integration with standard VLSI systems. It is highly scalable when modern high-performance resonator technologies are employed, making it useful for next generation RF front-end filters.

1.4. Reconfigurable RF Filters

Figure 12A:
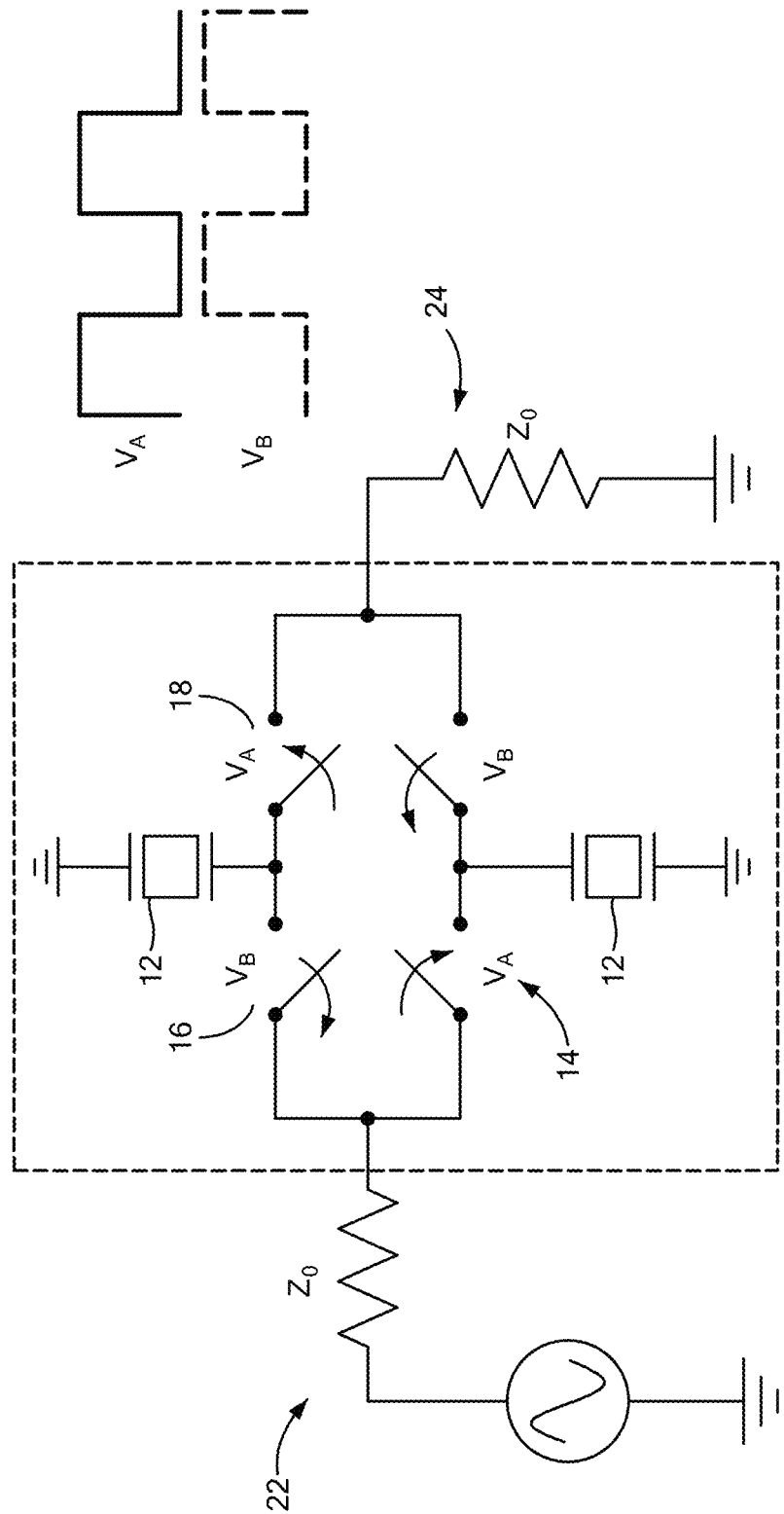
FIG. 12(a) illustrates a microsystem based on periodic commutation of MEMS resonators with complementary switching.

One embodiment of a reconfigurable filter system is depicted in FIG. 12(a). The passive element 12 (in this case a MEMS resonator) dynamically couples, via switch assemblies 14 (each with switches 16, 18), the two RF ports 22, 24 by periodically charging and discharging with a modulation period $T_m = 1/F_m$ that approaches the dominant time constant $\tau$ of the resonator loaded by the port impedance $Z_0$. For this network, the dominant time constant can be expressed as:

$$\tau = \frac{2Q_{LOAD}}{\omega_0} \propto \frac{1}{Z_0 \omega_{res}^2 K_t^2 C_0}$$

where $\Omega_{res}$ is the resonance frequency, $C_0$ is the resonator capacitance and $k_t^2$ is the electromechanical coupling coefficient of the resonator. Under these conditions, the resonator builds up a signal during the charging phase, and delivers the signal to the other RF port during the discharging phase. This is the underlying mechanism enabling its filtering capability, as a sinusoidal excitation outside of the resonator BW builds up a smaller signal than an excitation close to $\omega_{res}$. A differential actuation of two identical cells commutating with a $T_m/2$ time delay ensures power matching, so that every cell is connected for half of the modulation period to each port, with no overlaps.

Note that commutating at a rate comparable to its time constant, classic circuit linear sinusoidal analysis does not apply so that a detailed analytical treatment requires time-variant space state analysis or equivalent harmonic balance formulation.

Figure 13:
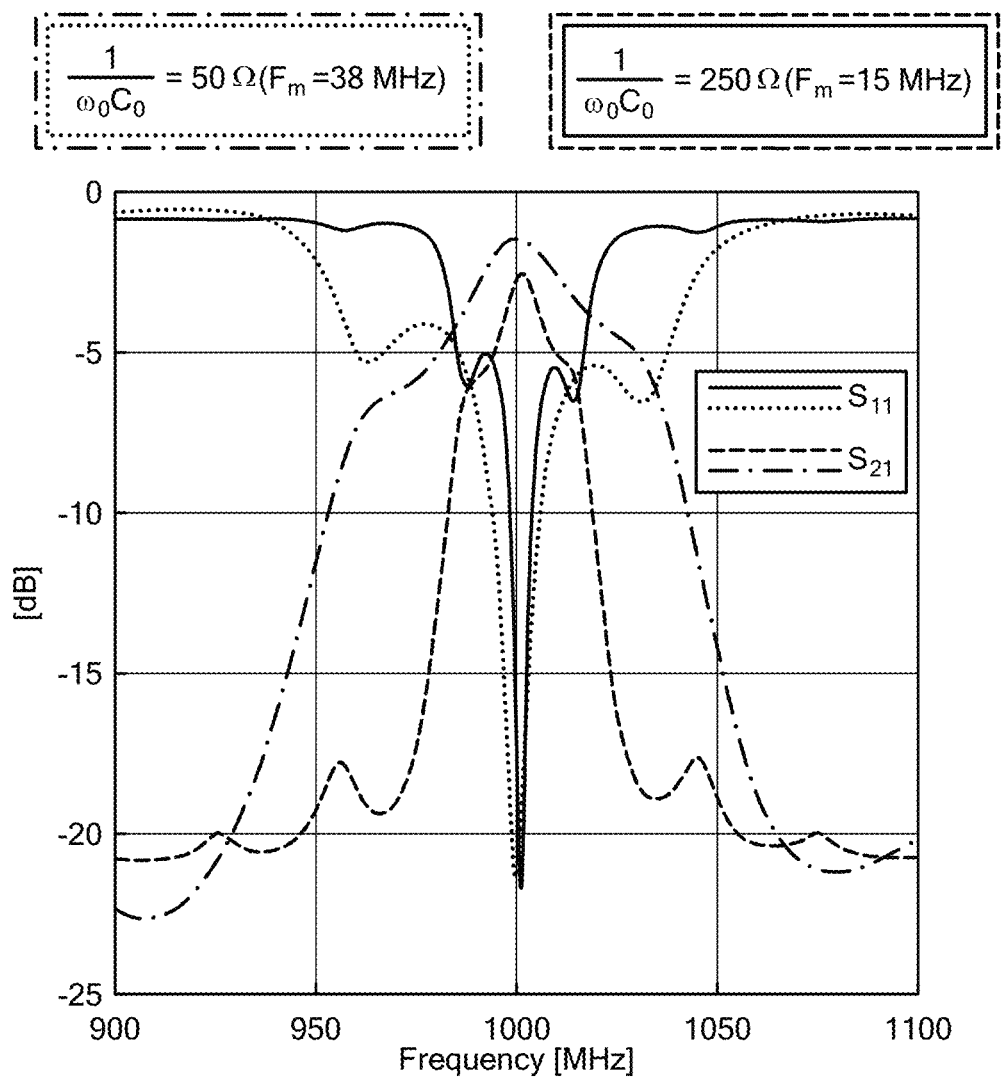
FIG. 13 illustrates dynamic $S_{21}$ and $S_{11}$ simulation, obtained using resonators with $k_t^2=7\%$, Q=1000 and $f_{res}=1$ GHz and two different $C_0$. In both cases the filter can be matched to 50Ω The filter BW is proportional to the resonators actuation area, and so does the optimal modulation frequency $F_m$. A 1 dB overhead is found for the smaller resonator case, due to $R_m$ scaling (in the equation).
Figure 14B:
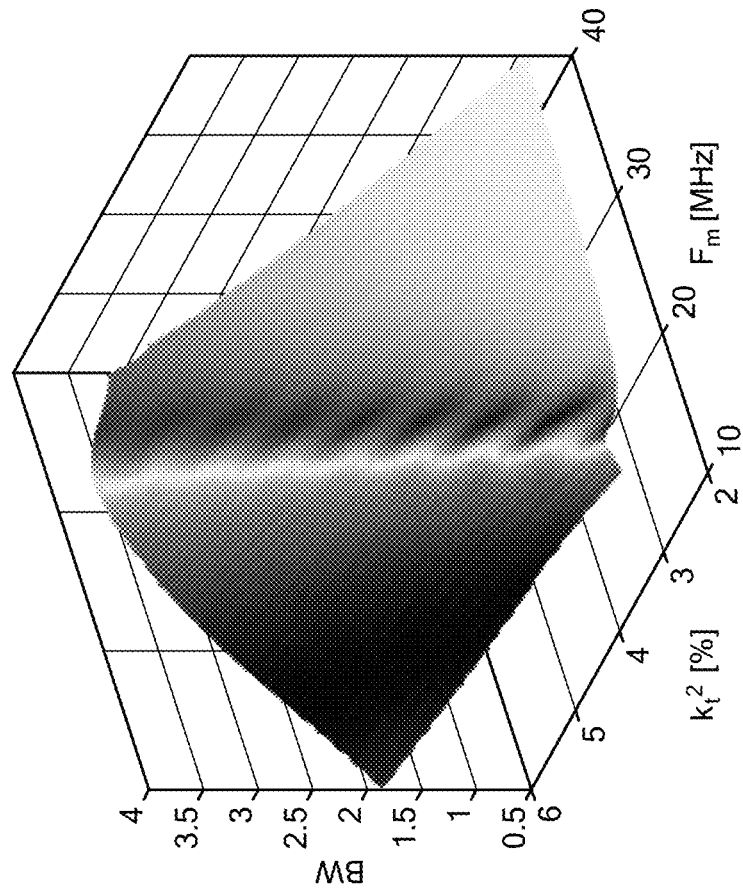
FIG. 14(b) investigates the BW for different piezoelectric couplings $k_t^2$. By scaling accordingly $F_m$, BW increases linearly with $k_t^2$ too.
Figure 14A:
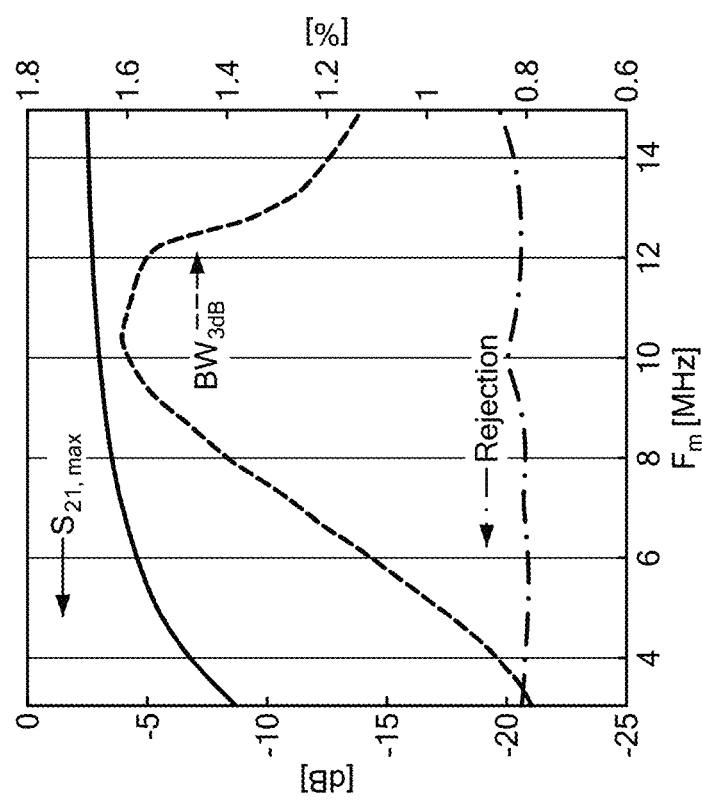
FIG. 14(a) illustrates the effect of $F_m$ on the circuit IL and BW. As $F_m$ increases, the minimum IL increases as the filter 3 dB BW increases linearly. The BW reaches an optimum point as discussed in the design section, then decreases. On the other hand, out of band rejection (OBR) stays constant, being determined by the resonators $C_0$.

To characterize the performance of the microsystem in FIG. 12(a) an equivalent electrical resonator model was built based on the Modified Butterworth-Van Dyke model, and a model of ideal resistive switches was implemented in a harmonic balance circuit simulator. Simulated performances (in FIG. 13) show accordance with these qualitative guidelines. Specifically, it was possible to obtain in simulation excellent Return Loss (RL) even with resonators with capacitance $C_0 \ll 1/(2\pi f_0 Z_0)$, at the cost of smaller filter BW. Moreover, as the resonator losses can be characterized by an equivalent resistance $R_m$, as reported in the equation:

$$R_m \approx \frac{1}{2\pi f_0 C_0 (k_t^2 Q)}$$

it is clear that, depending on the Figure of Merit FoM=$k_t^2 Q$ this might degrade the IL. Note that at any point in time each resonator is connected to a 50Ω load; hence the resulting BW in BP is proportional to 1/τ. To confirm this, a numerical sweep of the electromechanical coupling $k_t^2$ showed that, when changing accordingly $T_m$, the filter 3 dB BW increased with linear trend (FIG. 14(b)). Another feature highlighted by the simulation is that, for a given resonator and switch configuration, the 3 dB BW shows a certain degree of tunability, at minimal overhead of difference in terms of IL, as $F_m$ is changed (FIG. 14(a)). As for the BS mode, the notch BW is expected to be comparable to the $\omega_{res}$ modal Q.

Filters for mobile communication systems are currently relying on micro-scale frequency-trimmed piezoelectric resonators. Since modern radios operate in a wide range of the radio frequency (RF) spectrum, hundreds of resonators can be found on a single mobile radio. Frequency trimming often requires technological challenges, resulting in expensive fabrication processes for each of these filters. As the RF spectrum moves up to higher frequencies, these processes will become even more challenging and the need for new filtering solutions will be more and more urgent.

The technology described herein provides a RF filter architecture that relies on single frequency resonators per band. The performances of these filters are comparable with the current ones, but without the need for frequency trimming at the fabrication level. These new filter are capable of live reconfiguration, as they can exhibit bandpass and bandstop operation by controlling a signal inside the circuitry. This reprogrammability is of great usefulness, as bandstop operation is needed for safe operation and when the radio channel is not operating.

The circuit includes N identical parallel blocks, each one having a one-port resonator and two switches connected to the resonators on a common node and to the RF ports on the other node. Each switch is turned into ON and OFF state periodically with period T, and with a duty cycle D=1/N. The two switches in the same block are never on at the same time, so that a discrete set of time delays is possible. The circuit operates in such a way that the ON time of the each switch is approximately equal to the rise time of the resonator, loaded by the port impedance. Under these conditions, the resonator is able to build up a signal, storing the incoming energy. When the switches are commutated, this energy is released to the other RF port. Conversely, when the signal is outside the resonator bandwidth, the power is not stored in the resonator, resulting in overall isolation between the two RF ports. In a similar way, if the modulation period is much larger than the system, energy stored is dampened before the commutation so a notch is created around resonance. With a simple passive switched extra component, low reflection can be obtained in the near band when in bandstop mode.

2. A Fully Programmable Miniaturized RF Filter

By way of further description, an architecture based on time-interleaved commutation of passive RF resonators is described more particularly herein. This architecture behaves as a two-port filter network, with fully tunable instantaneous filter BW, fitting the needs for miniaturized, environment-aware RF signal processing components.

Figure 2:
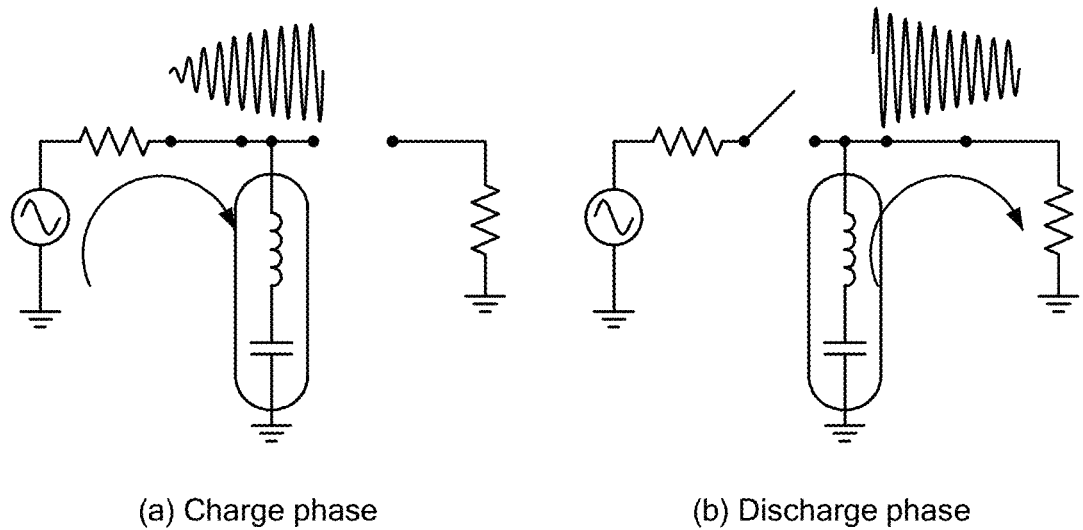
FIGS. 2(a) and (b) illustrate two snapshots of the time interleaved operation of a modulated resonator, which periodically switches between charging with energy from the input port, FIG. 2(a), and discharging it toward the output port, FIG. 2(b). In this way, the periodic modulation of an otherwise fully-reflective passive component acts as a resonant energy transfer medium between two RF ports, as long as the resonator does not reach steady-state response ($T_m \leq \tau$).
Figure 3:
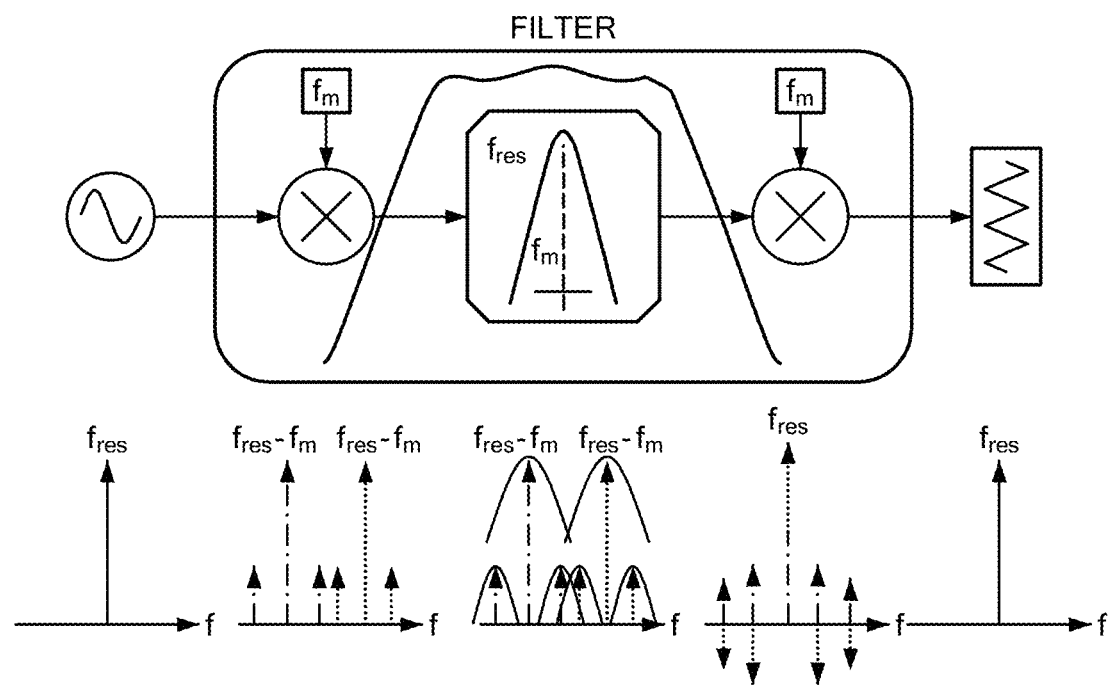
FIG. 3 is a harmonic diagram of dynamic operation of a modulated resonator. The frequency content at the input port undergoes two mixing operations, that result in overall input-output spectral linearity. During the mixing process, the generated harmonics are weighted by complex factors dependent on the commutated element impedance (at each harmonic of the system) that result in maximum transfer at any cross modulation tone (CMT) $f_{res} \pm kf_m$, resulting in the characteristic $f_m$ dependent poles, visible in FIG. 4 and posing the base for the BW tunability of this architecture.

Its operating principle, in the minimal form, it is shown in both its time domain, FIGS. 2(*a*) and 2(*b*), and frequency domain, FIG. 3, representation.

2.1 Principles of Operation

In FIG. 2(*a*), for a first fraction D of the modulation period $T_m$, a resonator with resonance frequency $f_{res}$ is connected to the input port, so it can collect energy from the input signal. This energy is periodically released to the load (FIG. 2(*b*)). The circuit risetime $\tau = Q_L/(\pi f_{res})$, where $Q_L$ is the loaded Q of the resonator, represents the time needed for the resonator to build up a signal.

In the frequency-domain representation of FIG. 3, the first switch (mixer) modifies the frequency content, spreading the input power in sidebands (cross-modulation tones, CMT) spaced $nf_m$ (where $f_m=1/T_m$) from the fundamental tone. If the first CMT falls outside the bandwidth of the resonator (approximately $BW=1/\tau=\pi f_{res}/Q_L$), the down-conversion reconstructs half of the input power, around $f_{res}$.

The time-domain picture highlights that the system resembles a dispersive transmission line, centered around $f_{res}$, and the transfer medium is artificially synthetized by the periodic charge/discharge of a resonator. The frequency-domain picture can aid in illustrating how the signal modulation results in artificial poles in the system: an input signal at $f_{res} \pm f_m$ experiences a very similar maximum-transfer process, except that only approximately a quarter of the power is delivered to the load, according to the up-down conversion abovementioned.

Figure 4A:
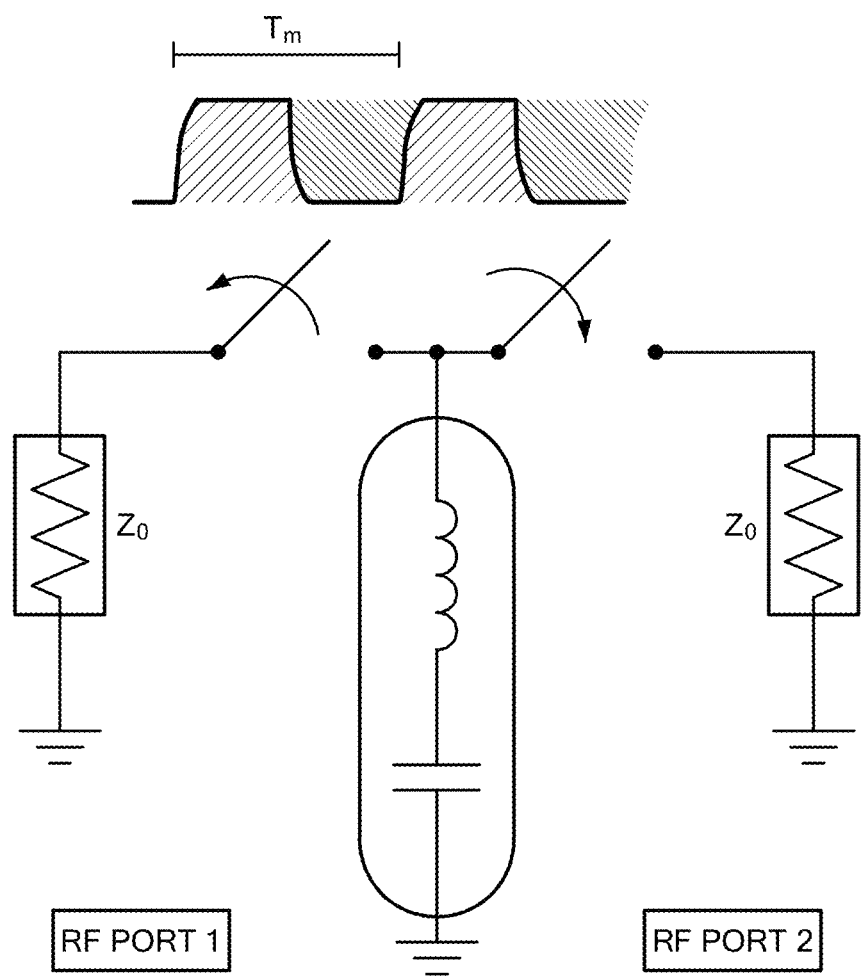
FIGS. 4(a), 4(b), and 4(c) illustrate a circuit schematic (a), simulated $S_{21}$ in (b) and $S_{11}$ in (c) for the simple case of a single commutated resonator, as described in Sec. 2.1. For the simulations, a resonator with $f_{res}=100$ MHz, $Q_L=20$ was commutated in a 50Ω system, with various fractional $f_m$ (as reported in the legend). As discussed, half of the signal voltage is transmitted (6 dB IL) for $f \approx f_{res}$, whereas approximately a quarter is transmitted $f \approx f_{res} \pm f_m$. It is clear from both $S_{21}$ and $S_{11}$ plots that artificial external poles are introduced in proximity of $f \approx f_{res} \pm kf_m$, with k integer.
Figure 4B:
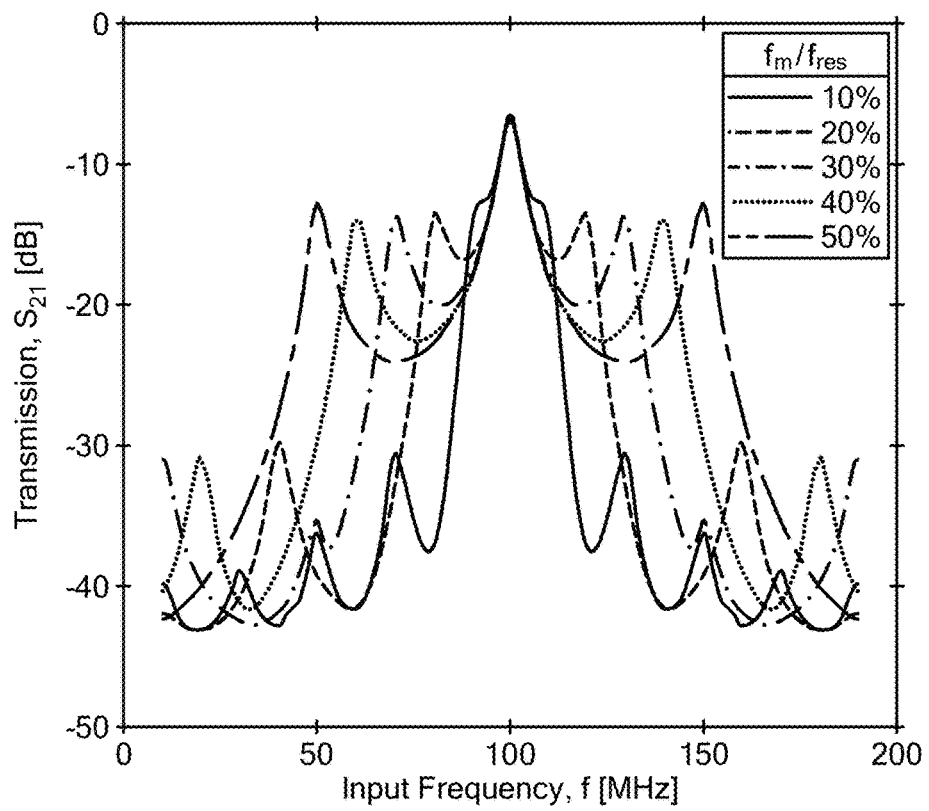
Figure 4C:
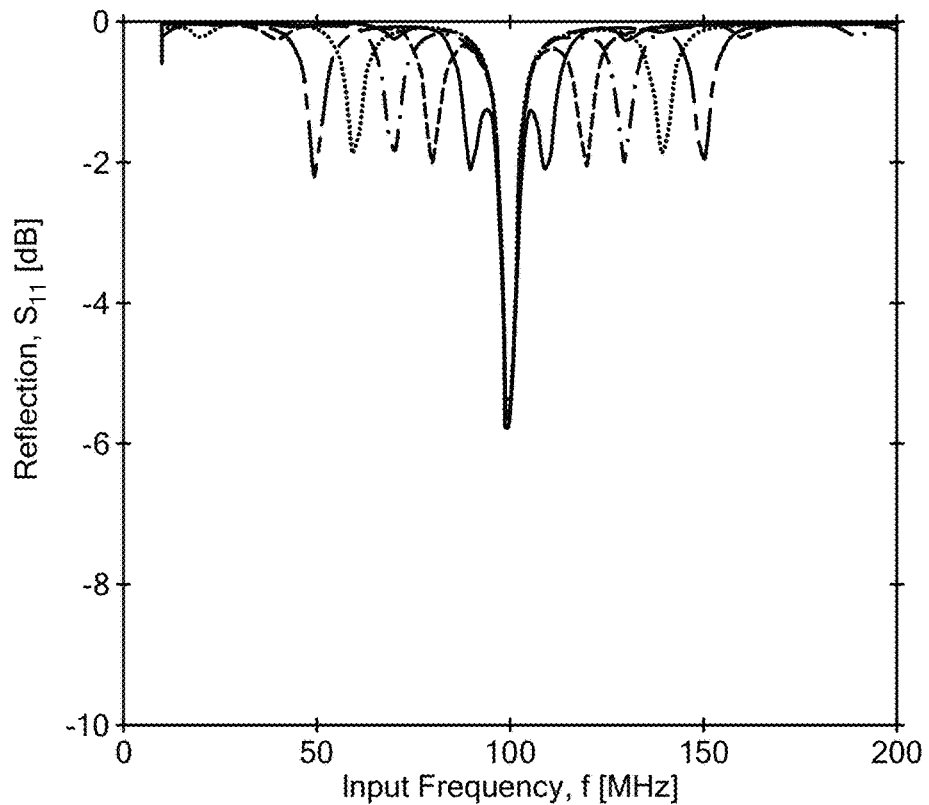

These qualitative discussions are confirmed by the circuit simulations plotted in FIG. 4. Since these poles are entirely determined by $f_m$ and ultimately spaced by the same quantity from $f_{res}$, it is possible to entirely control the filter BW by adjusting $f_m$.

While most passive LTI filter designs rely on different resonance frequencies $f_{res}$ and Q to implement a given shape factor and BW, these cells rely on single resonances for a given band, and hence by controlling a single $f_{res}$ it is possible to vary the filter $f_c$, increasing the adaptability of this system in RF frequency-agile applications.

2.2 Architectures

As qualitatively introduced in Sec. 2.1, the single-cell structure of FIG. 4 can transfer only half of the input power around $f_{res}$. This is confirmed by the time-domain observation that for half of the time the switch is not connected to the RF source, so that reflection cannot be lower than ½.

Figure 5A:
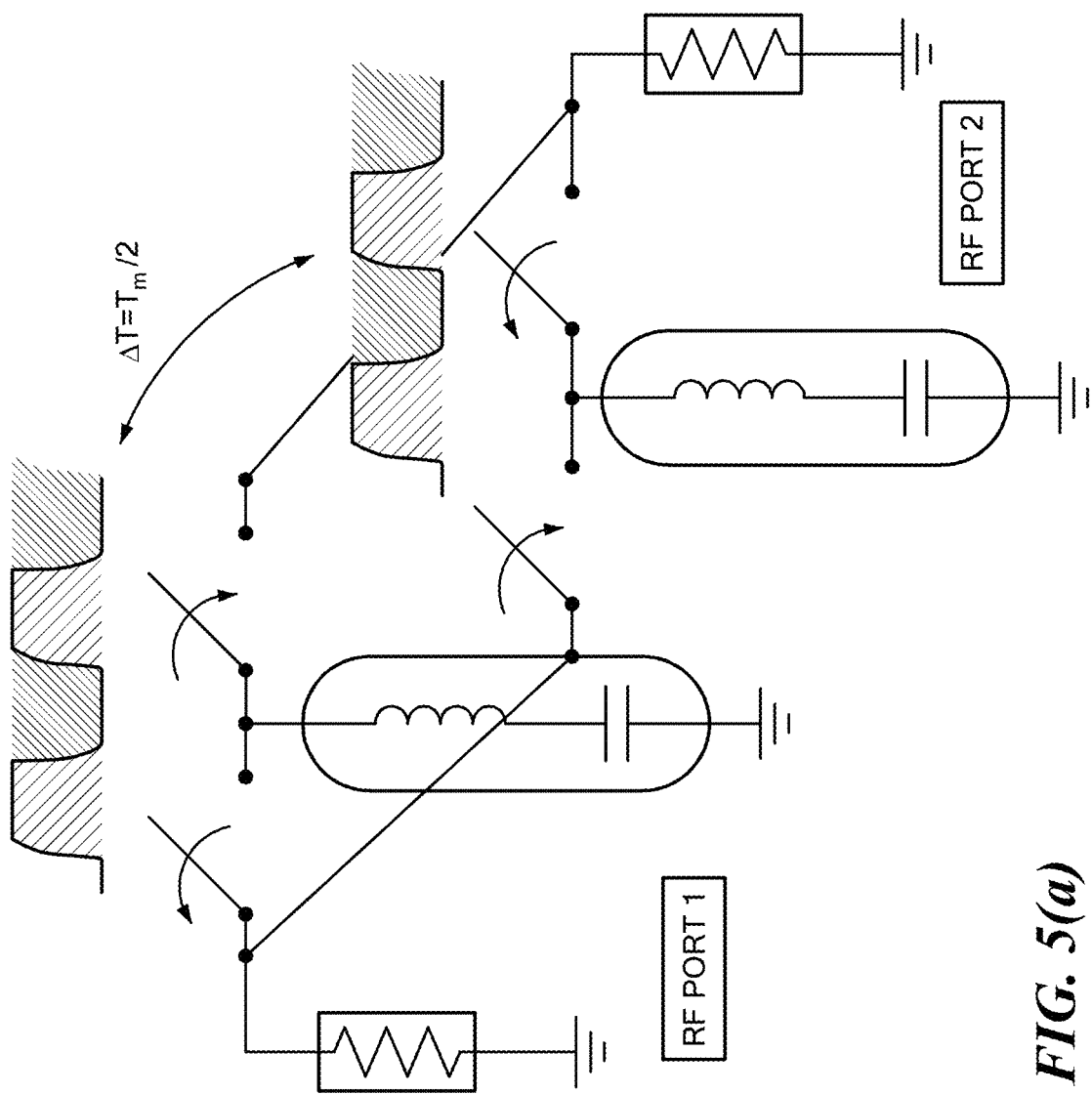
FIGS. 5(a), 5(b), and 5(c) illustrate a circuit schematic (a), simulated $S_{21}$ in (b) and $S_{11}$ in (c) for a commutated 2-path filter, obtained with two replicas of the single-cell of FIG. 4(a) actuated with complementary control signals (i.e., $\Delta T=T_m/2$). The simulations are compared for the same setup to the single-cell results of FIG. 4(a) (for $f_m=0.2f_{res}$). While the pole frequencies are the same, absolute values of $S_{21}$ approach unity, and the filter results matched to $Z_0$ around its center frequency $f_{res}$.
Figure 5B:
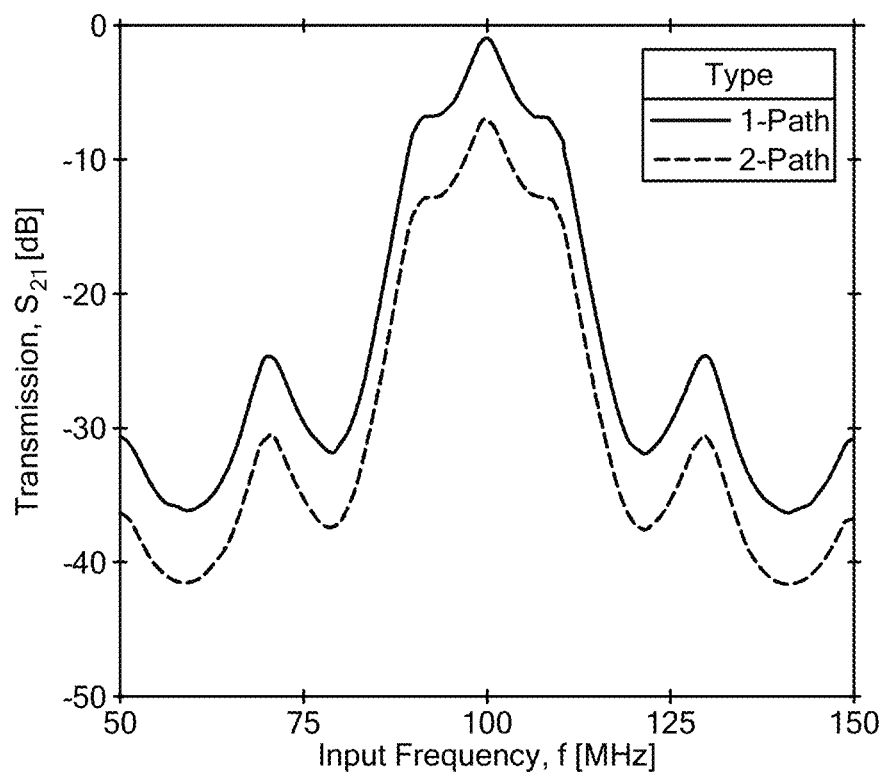
Figure 5C:
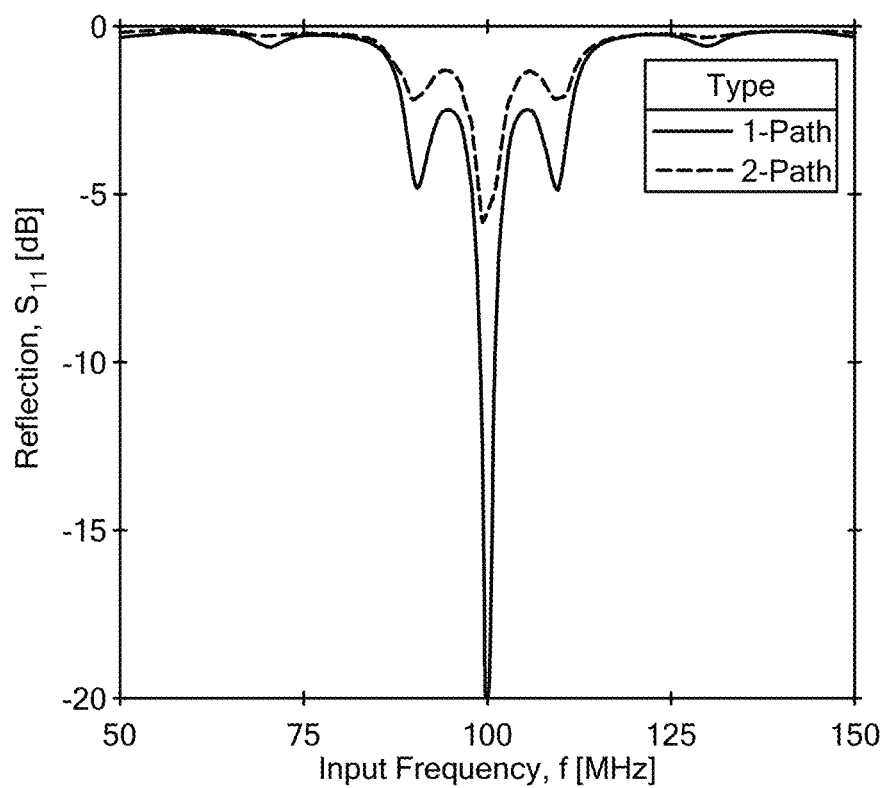

A configuration matched to the input impedance, capable of nearly unitary power transfer requires at least two paths, so that at every instant the input port is connected to at least one resonator. For this reasons, a complementary actuation scheme allows significant improvement of loss performances, on top of better input power matching. This architecture is discussed in FIG. 5(*a*) with S-parameters comparison to the single cell, to highlight the substantial performance improvement.

Passing from a single cell device to a complementary structure, the pole location is not modified, nor is the selectivity of the filter compromised. The capability of adding nodes to the circuit without compromising critical parameters such as loss, selectivity and bandwidth is a feature of such a structure, and it pertains to the LTV nature of the filter. On the contrary, in passive filter designs, adding resonators to any structure introduces new poles, inherently resulting in unease of reconfiguration.

Figure 6A:
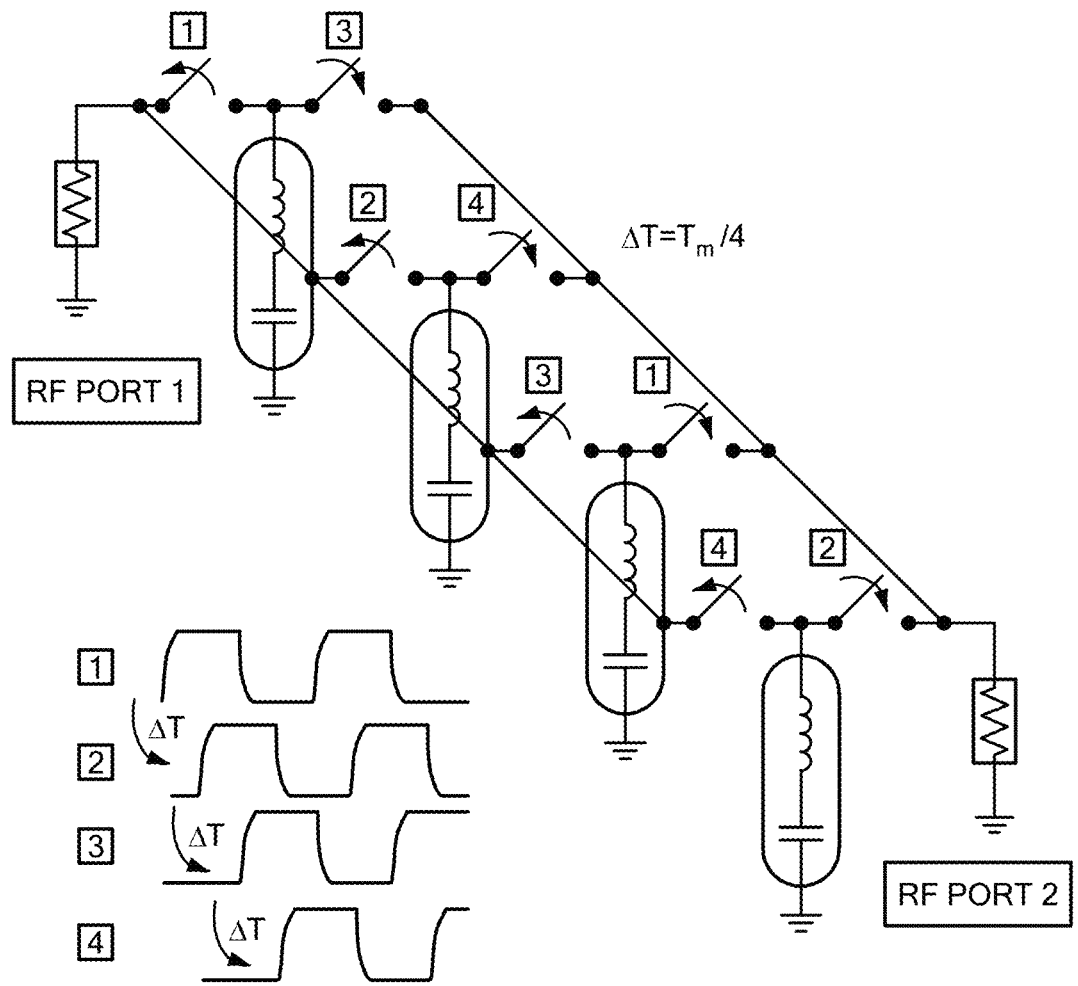
FIGS. 6(a), 6(b), and 6(c) illustrate a circuit schematic (a), simulated $S_{21}$ in (b) and $S_{11}$ in (c) for a reconfigurable four-paths bandpass filter. The four branches are controlled in quadrature (i.e., $\Delta T=T_m/4$) at the same modulation frequency $f_m=1/T_m$. Note that in this case, at any time, every connected resonator to either port shares RF signal with the resonator of the following phase for an overlap time $T_m/4$, resulting in a more complex modulation pattern that the one discussed in Sec. 2.1. Simulation results for the same setup of FIG. 5(a) reveal substantial improvement in filter shape, both in filter transmission and reflection with respect to the single cell scenario. In particular, side edge of the filters have TX and RL values approaching the main lobe, so that wider BW tuning range can be achieved.
Figure 6B:
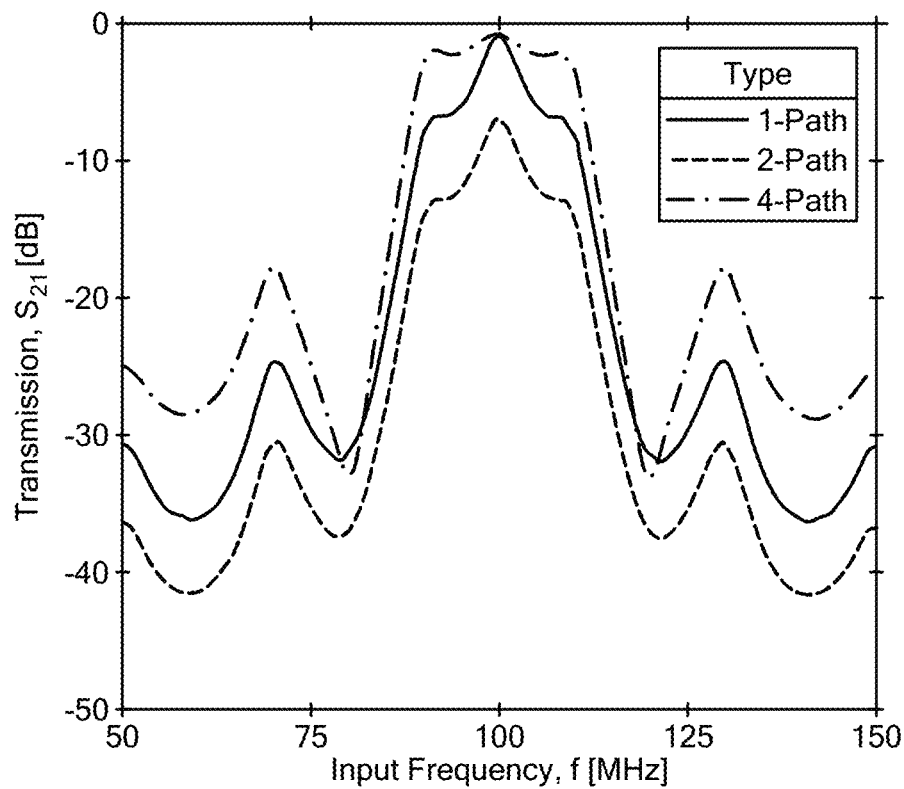
Figure 6C:
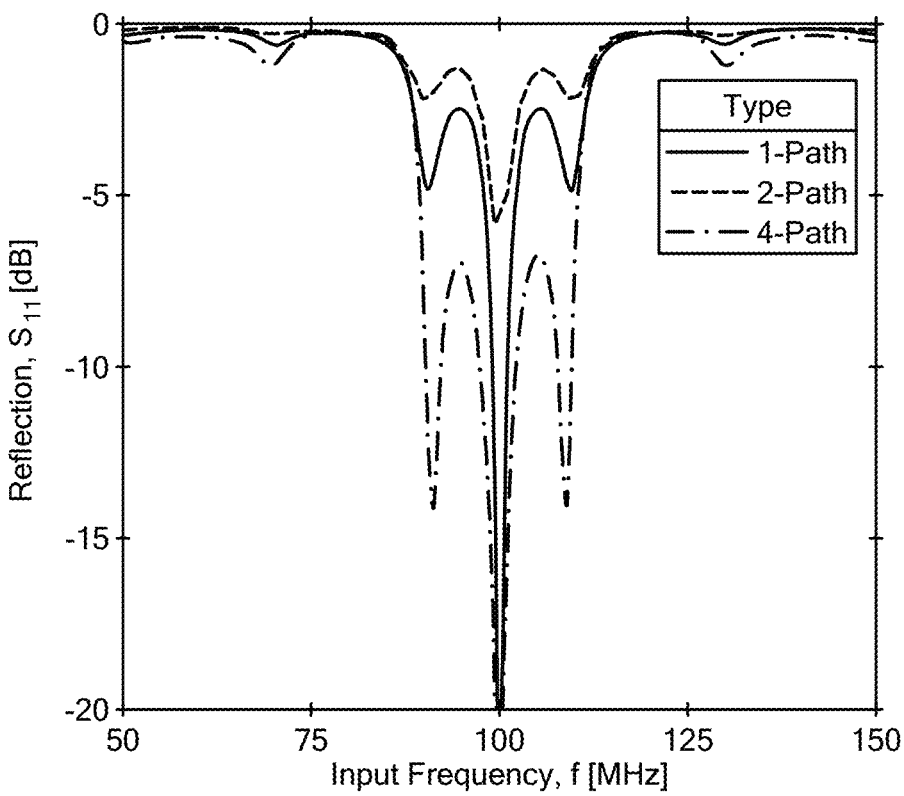

While the passband around $f_{res}$ shows minimal loss, sideband poles at $f_{res} \pm f_m$ have higher losses, due to inherent CMT loss, similarly to the single cell case. To overcome this issue, it is possible to optimize further the modulation pattern by introducing another couple of modulated resonators, as in FIG. 6.

Figure 7A:
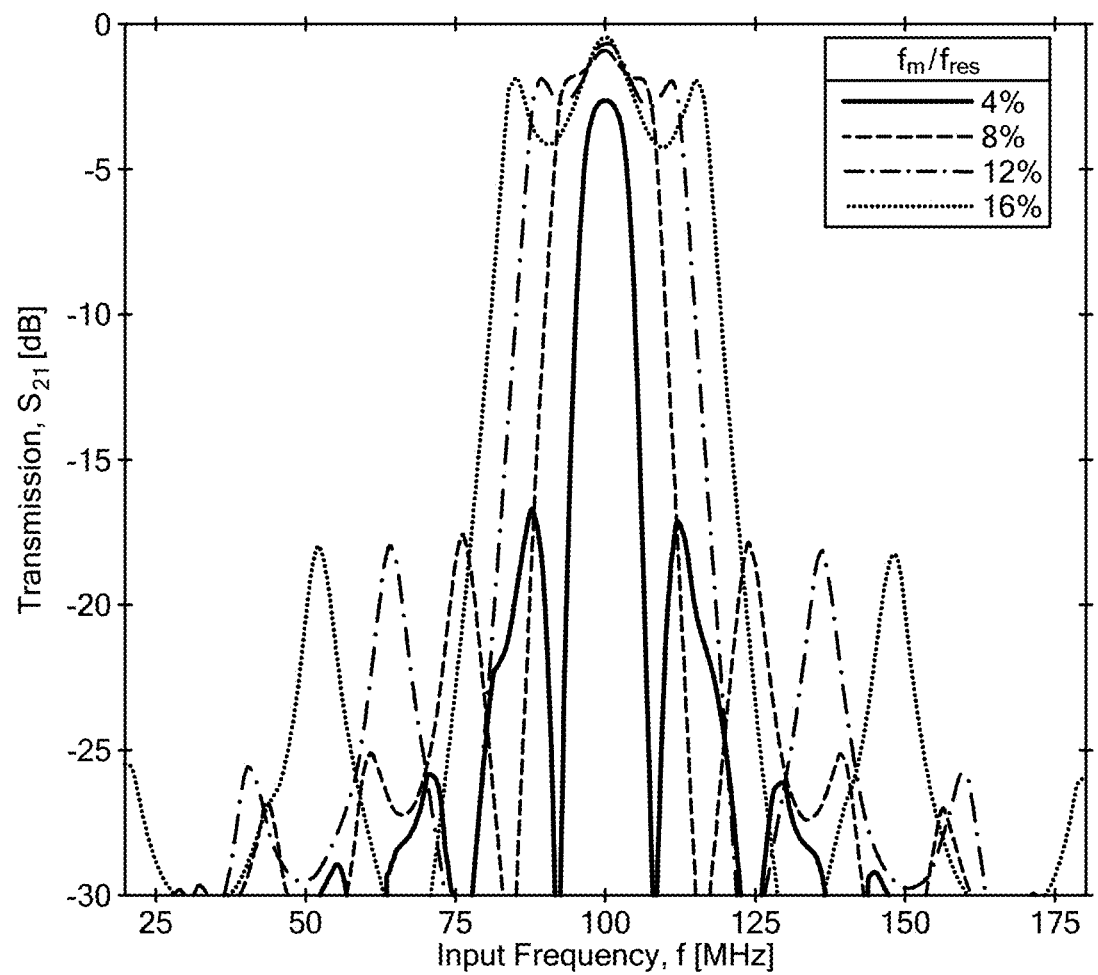
FIG. 7(a) illustrates (a) simulated $S_{21}$ (for same test conditions of FIG. 4(a)), for various modulation ratios.
Figure 7B:
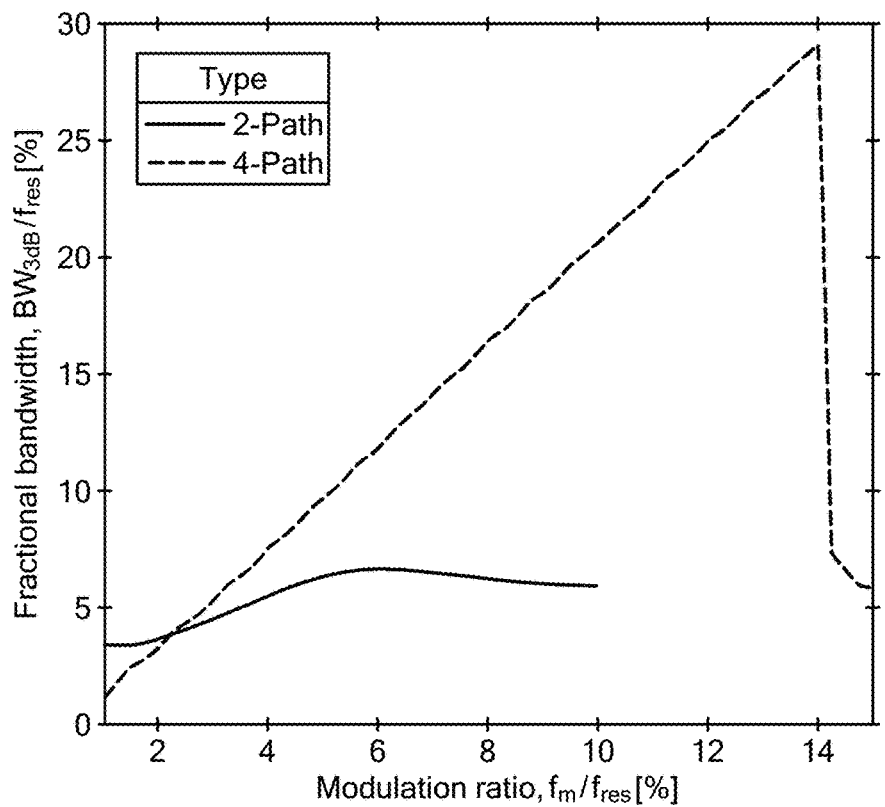
In FIGS. 7(b) and 7(c) respectively 3 dB BW and IL are compared with 2-path filter performances in FIG. 5(a). Large bandwidth reconfiguration (>500%) is achieved for the 4-path topology, while keeping the same IL as in the 2-path one.
Figure 7C:
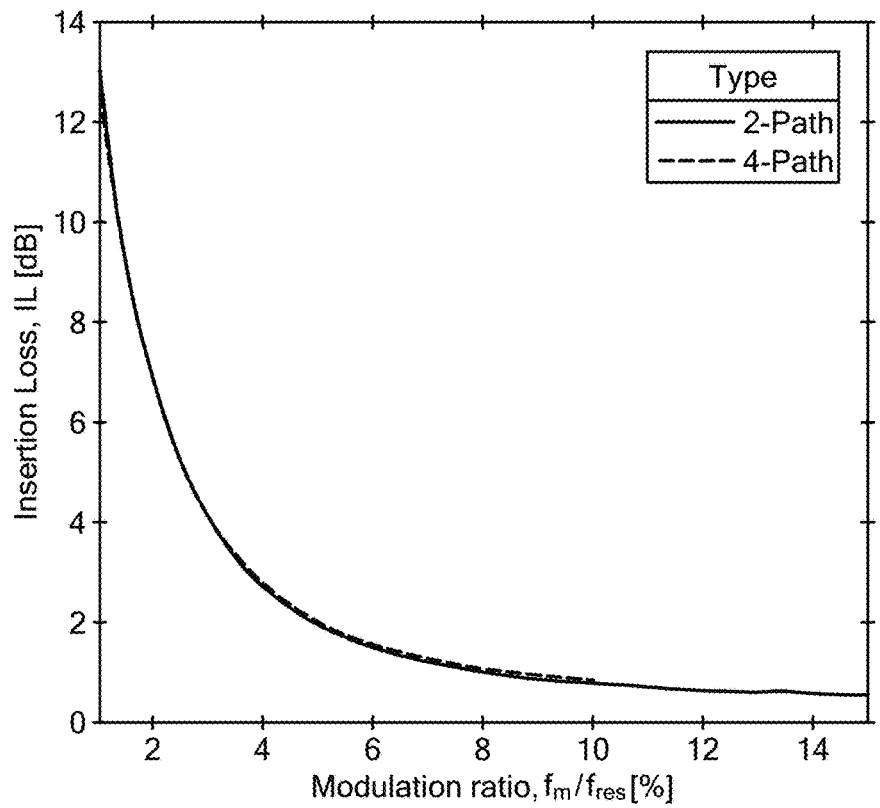

In this design, having a quadruple of resonators modulated in quadrature with 50% duty cycle, the charge/discharge pattern includes overlap times, so that the input signal is charging more than one resonator at a time. This improved modulation scheme results in higher transmission at the passband edges, ultimately resulting in more than 500% 3 dB bandwidth tunability, without degrading IL (FIG. 7). For this topology, sideband poles approach unitary $S_{21}$, so that an effective linear relation between filter 3 dB BW (FIG. 6(*b*)) and $f_m$. The trend eventually stops as the in-band ripple exceeds the 3 dB threshold.

The advantages introduced by these filter topologies are even more evident when center frequency reconfiguration is required: typically, reconfigurable filters based on nonlinear elements such as varactors or nonlinear ferroelectric resonators rely on a large amount of control signals to either induce voltage-induced capacitance modulation or for digitally switching between capacitor banks to shift each resonance frequency in the filter, so as to obtain an overall translation of the filter $f_c$.

Figure 8A:
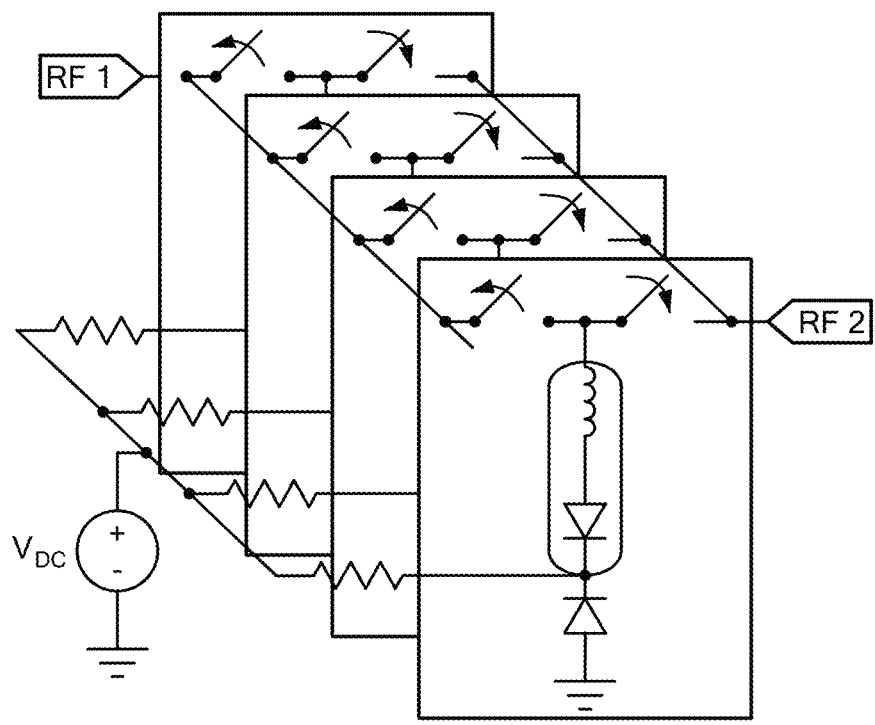
FIG. 8(a) illustrates (a) a filter architecture capable of real-time BW and $f_c$ reconfiguration based on commutated resonators. As per FIG. 6(a), BW tunability is achieved through $f_m$.
Figure 8B:
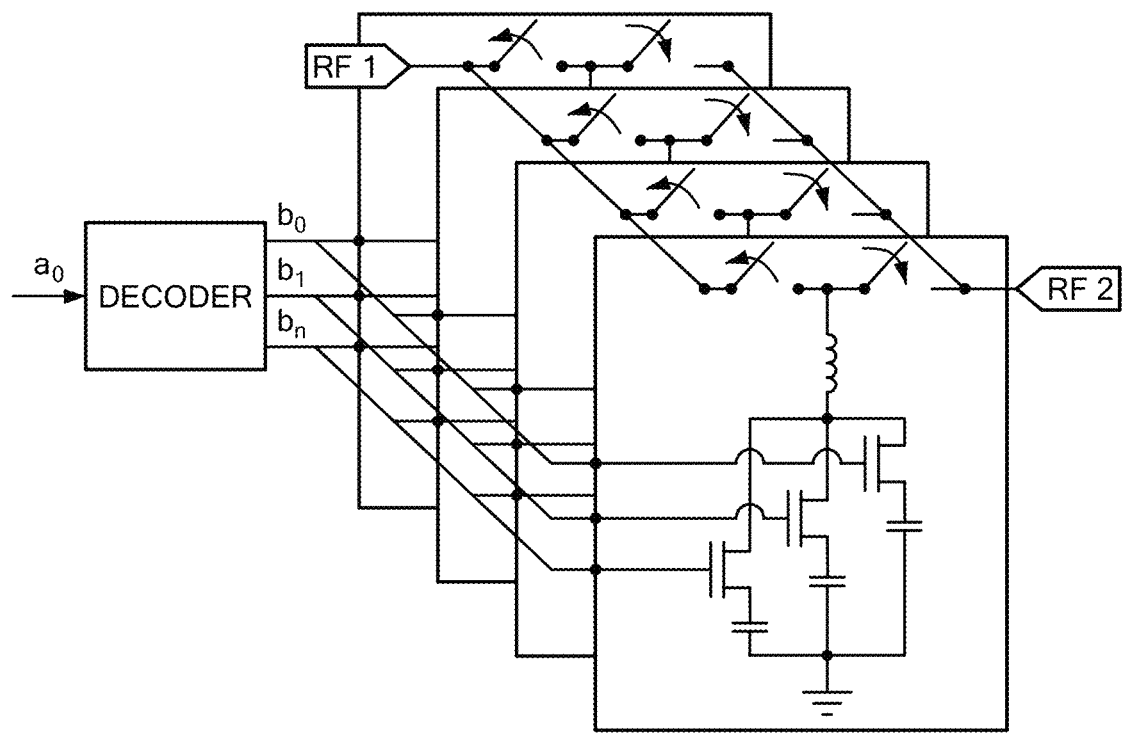
FIG. 8(b) illustrates a similar solution, where $f_c$ tuning is obtained by means of a decoder, driving digital signals on the gate of multi-tap capacitors.
Figure 8C:
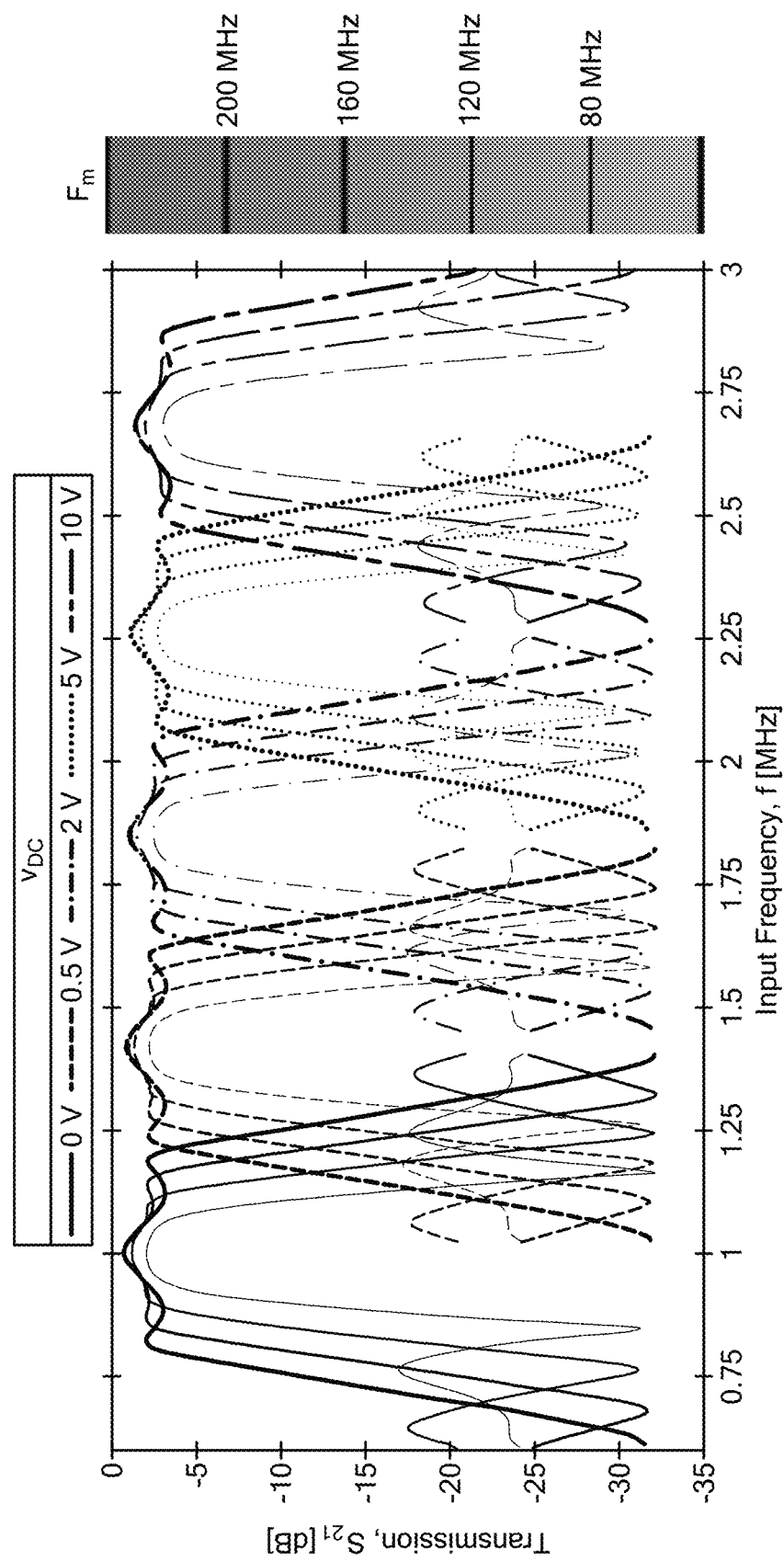
In FIG. 8(c), simulated $S_{21}$ of the filter, using realistic varactor models and 50 nH inductors, shows large $f_c$ programmability (3 5:1) with moderate $V_{DC}$ levels (0<$V_{DC}$<10V). Note that, according to this design, required $f_m$ does not scale with $f_c$, allowing digital control circuitry to be shared among bands, thus further simplifying practical filter design.

Using a single resonance frequency per filter, in turn, considerably simplifies the electronics required to shift $f_c$. For example, in the situation in FIG. 8 where a continuous control on $f_c$ is desired by acting on resonators $f_{res}$, a single $V_{DC}$ control signal can achieve a large modulation of $f_c$. As another example, if a digital-type of control is desired, identical copies of capacitor banks can be easily implemented on-chip to realize CMOS compatible reconfigurable resonators. Note that, as for the analog counterpart, a single digital control unit (a decoder in this case) is capable of multiplexing identical signals on all the paths, so to achieve large $f_c$ reconfiguration with minimal processing power.

Figure 9A:
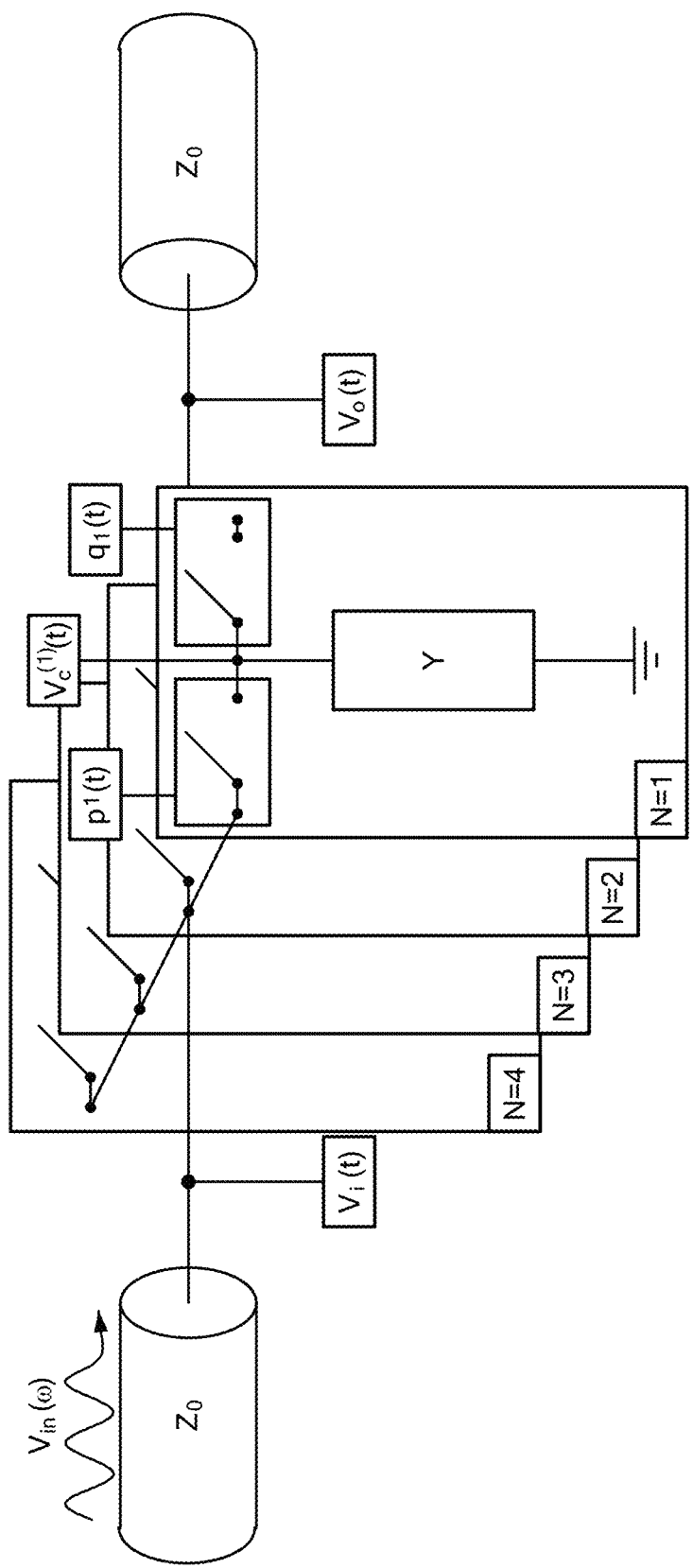
FIGS. 9(a), 9(b), and 9(c) illustrate (a) a modeled network, made of N path filters that periodically modulate passive one-port elements of admittance Y (the example shows N=4), and ideal modulation signals for the case of non-overlapped clocks (b) and overlapped clocks (c). The shadowed regions represent the switch in the ON state, otherwise it is in OFF state.
Figure 9B:
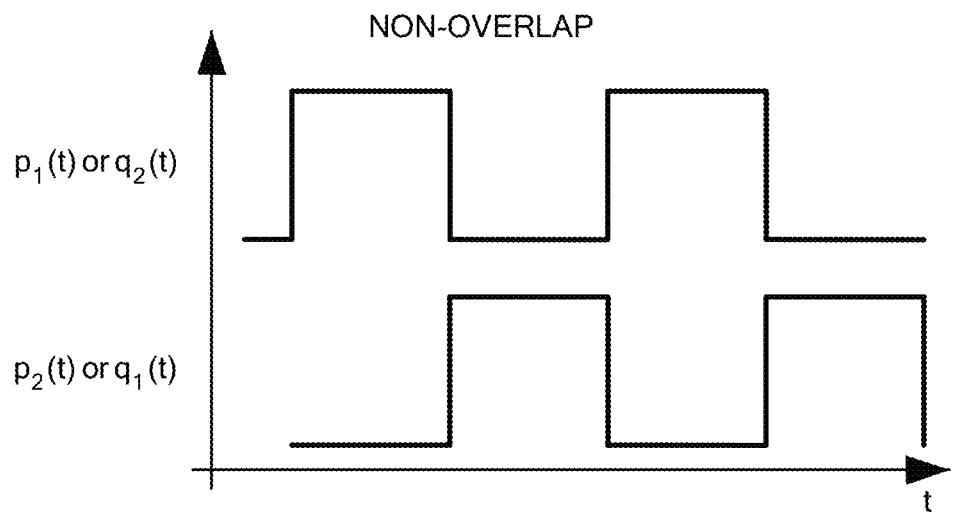
Figure 9C:
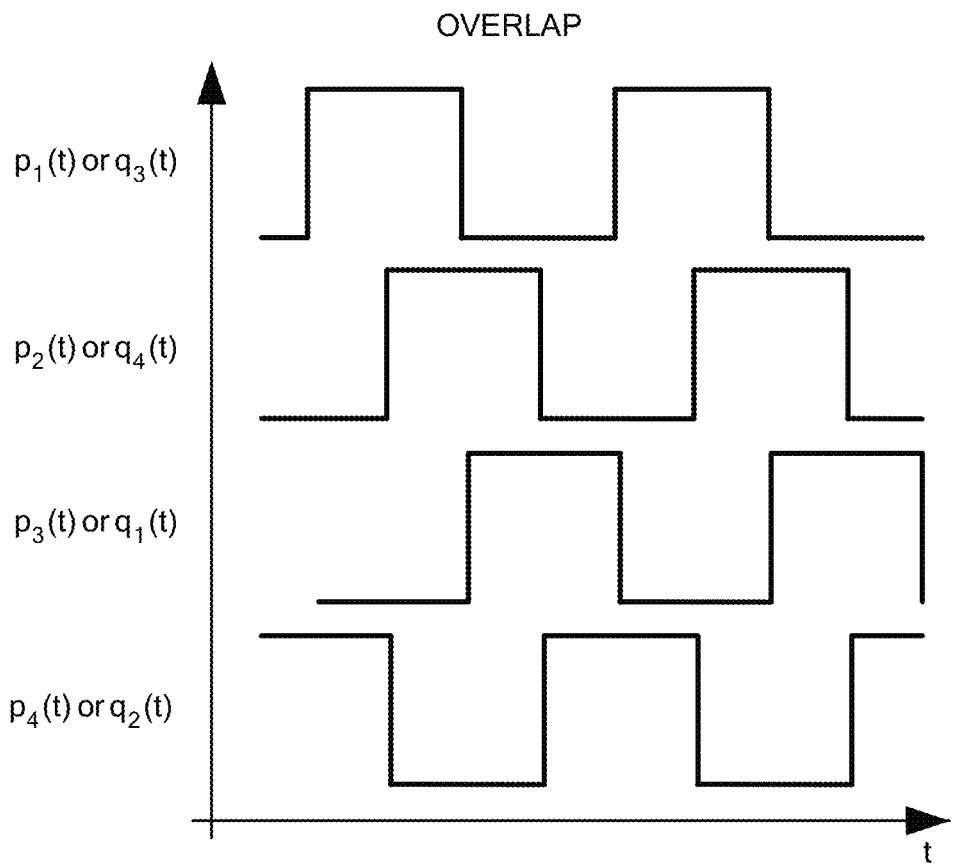

FIG. 9 illustrates another embodiment with an N-path architecture and illustrating modulation signals with overlapping and non-overlapping clocks.

The technology described herein can provide a number of advantages when the resonator is of an electromechanical (piezoelectric) type, as usually found in RF systems. In fact, in conventional filters, resonator area trades off losses, matching to RF port impedance and out-of-band rejection. This system can provide suitable performances in a cost effective footprint and does not require resonators with different natural frequencies. The modulation period T can be increased by increasing the number of identical parallel cells, resulting in minimized power consumption from the switches (the only component that drains power in this design). The system is able to periodically transfer energy between RF ports, with frequency selectivity.

The system can provide advantages such as frequency trimming for same band filters, solved with a simple architecture, resulting in cheaper filters. High RF filtering performances can be achieved with small resonators, with lower area consumption and improved out of band rejection in a single cell. Temperature sensitivity does not suffer from temperature induced drift from different frequencies resonator. Active and real time reconfiguration between bandpass and bandstop filter can improve the rejection of close-band interferers in multichannel radios.

A device that can operate as a bandpass filter or as a bandstop filter can be used to reduce jamming interference at selected frequencies, relaxing specification constraints on readout electronics at RF, ultimately resulting in lower power consumption and better interference/jamming immunity.

The technology can enable a low-power electronic control on the filter response at the chip level, enabling smart radio functionalities such as selective spectrum scanning and spectral programming.

The filter architecture requires less frequency trimmed resonators per channel, hence enables cheaper processing for RF filtering. The reconfigurable filters reduce the number of physical filters needed in a front end, as a single filter can provide band pass and band stop response. A smaller footprint can lead to cheaper product.

The system has several applications. For example, the system can be used in reconfigurable radio front ends, in mobile communication circuits, and in millimeter wave mobile devices. The system can be used in harsh temperature environments, such as space and military environments.

3. Experimental Results 3.1 First Experiments

Figure 12B:
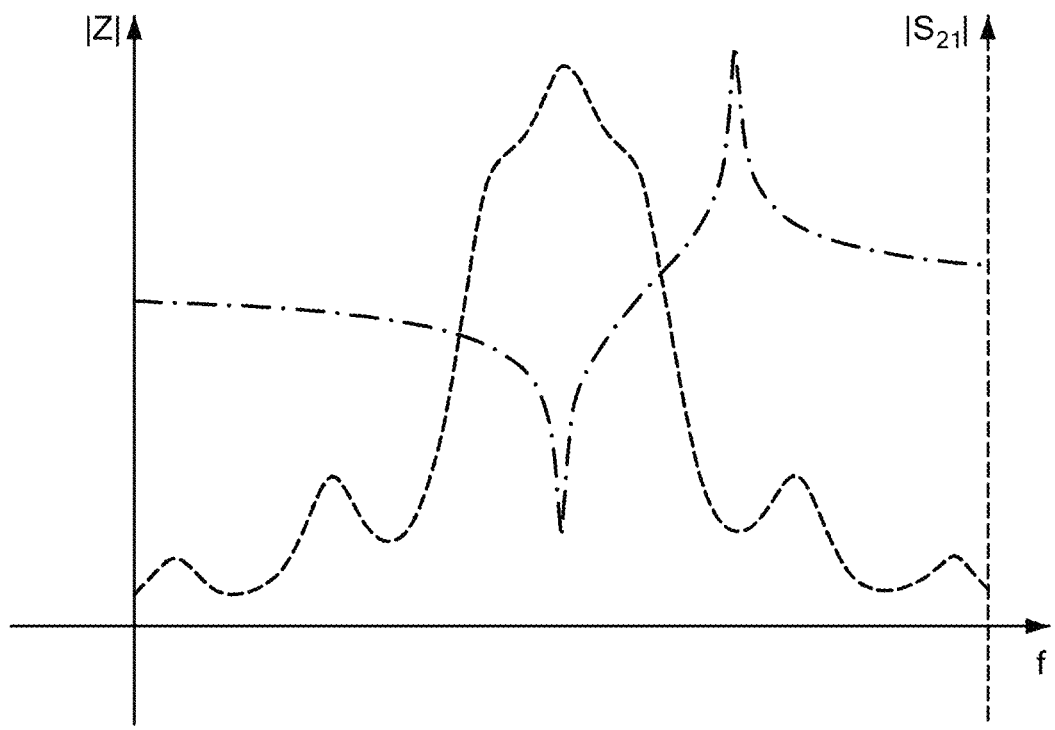
FIG. 12(b) illustrates the frequency response of the network in Pass-Band mode. The green curve (Z) highlights that the $S_{21}$ response is obtained with two identical resonators, differently from the ladder filter in FIG. 11(a). Moreover, thanks to the dynamic regime of the system, $Z_0$ matching and better out-of-band rejection can be obtained with smaller resonators.
Figure 12C:
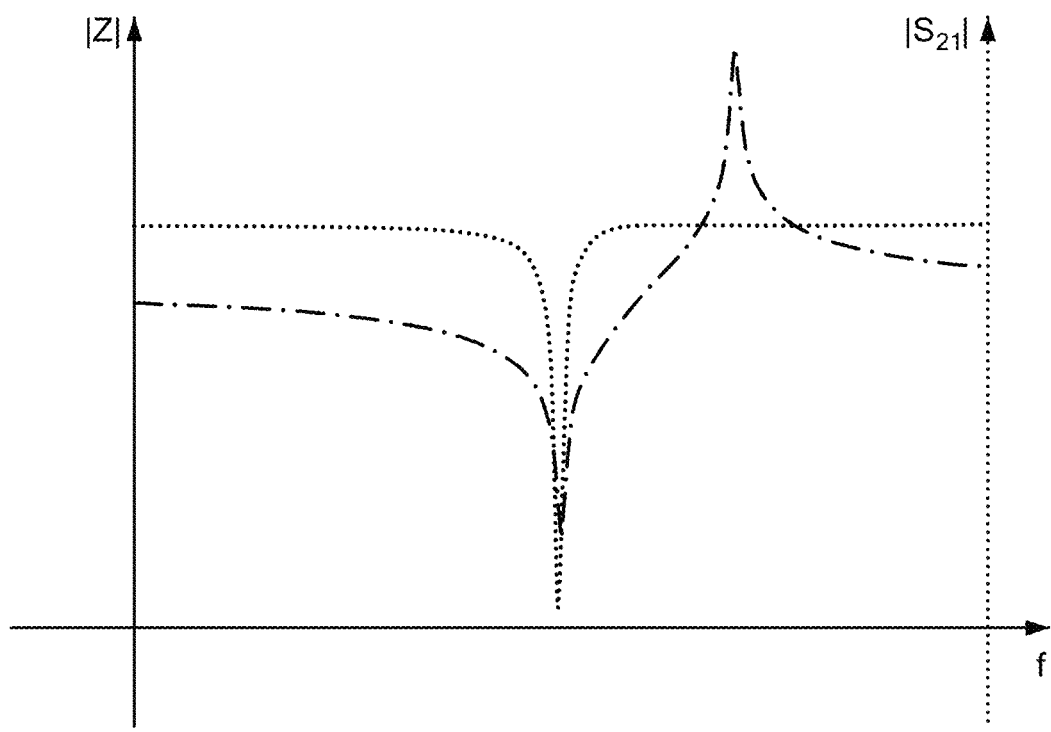
FIG. 12(c) illustrates a notch-like response, when the same MEMS structure is actuated at a much lower frequency, enabling full real-time reconfigurability.
Figure 15A:
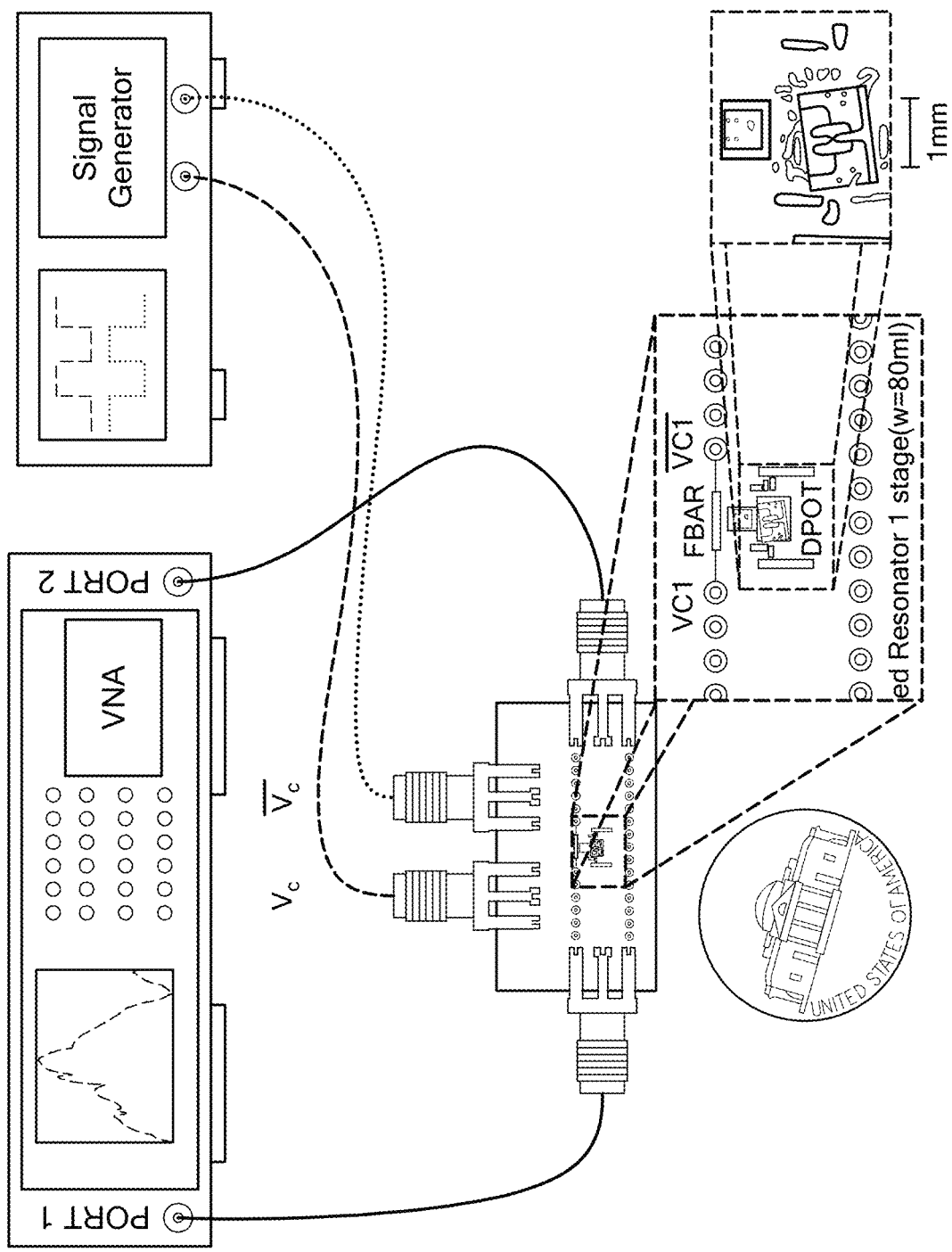
FIG. 15(a) illustrates a MEMS N-Path filter prototype and measurement setup. The insets show the Broadcom™ FBAR and the Qorvo™ switch chips mounted on a PCB. Active area is 0.25 mm² for FBAR chip and 1.25 mm² for the GaAs double pole double throw (DPDT) switch. The periodic control signal on DPDT switch is generated off-chip.
Figure 15C:
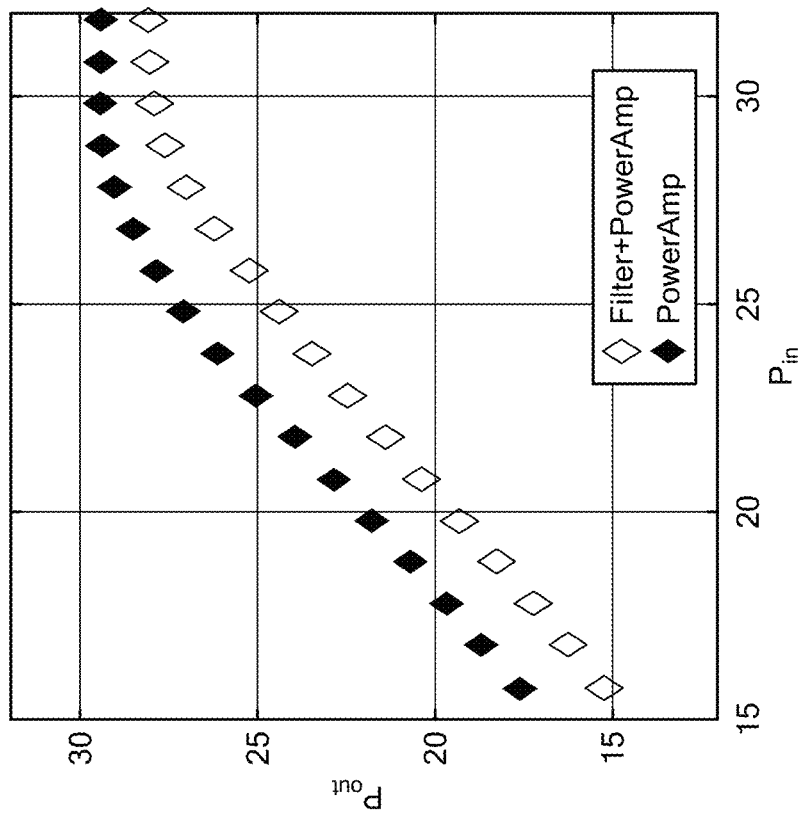
FIG. 15(c) illustrates power handling performance. Linearity is limited by the test setup above 30 dBm.
Figure 15B:
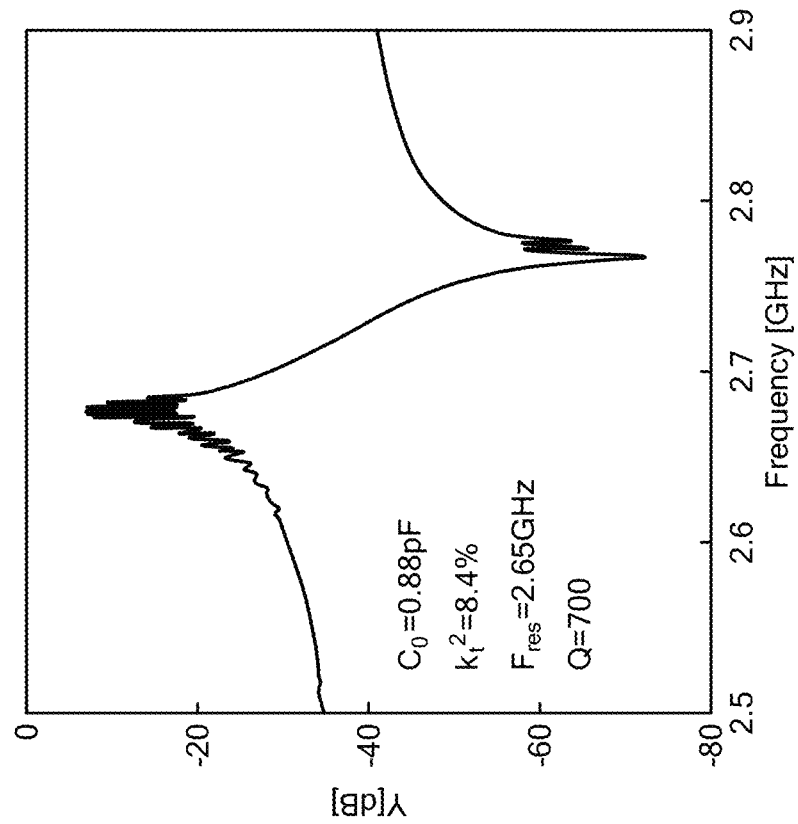
FIG. 15(b) illustrates the mBVD-fitted admittance of the FBAR used in this circuit. The rise-time for the switch is estimated to be in the order of 1 ns.
Figure 16B:
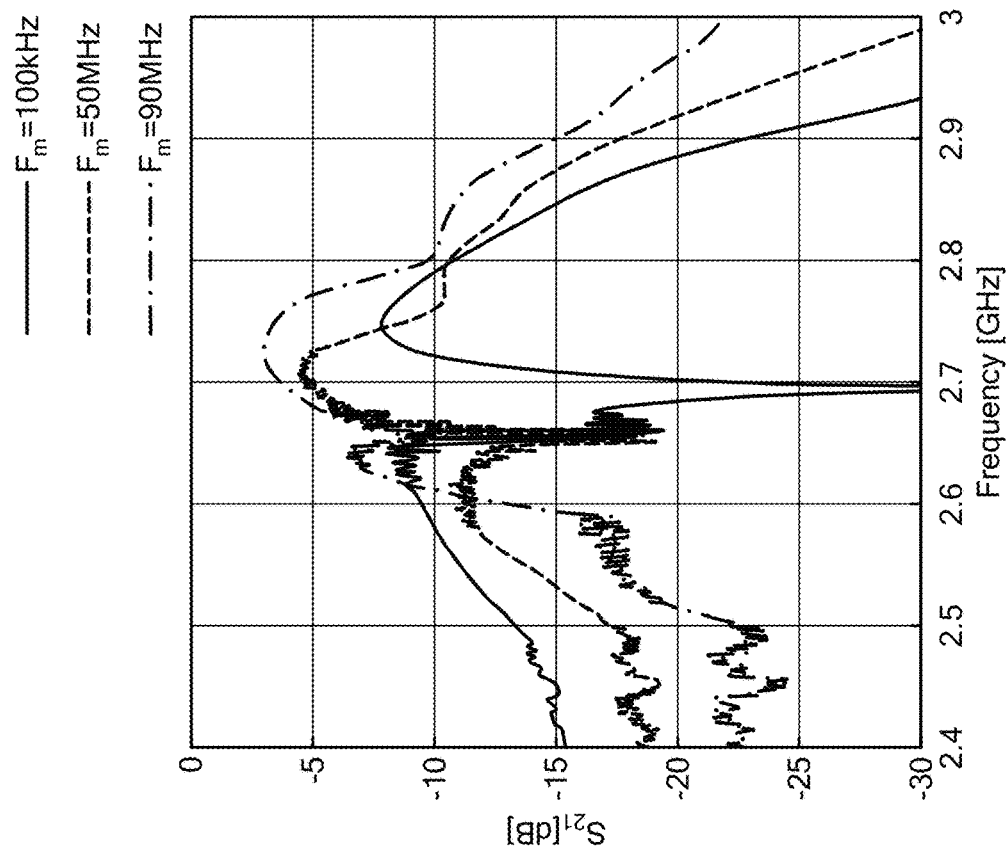
Figure 16A:
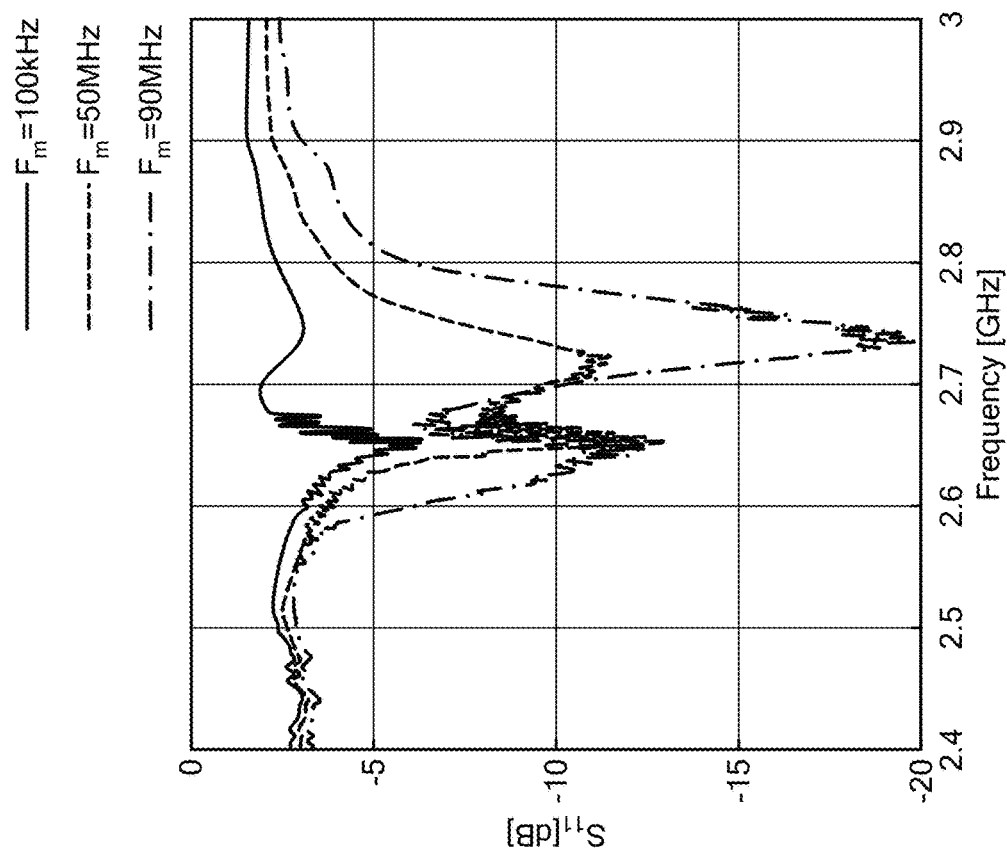
Figure 16D:
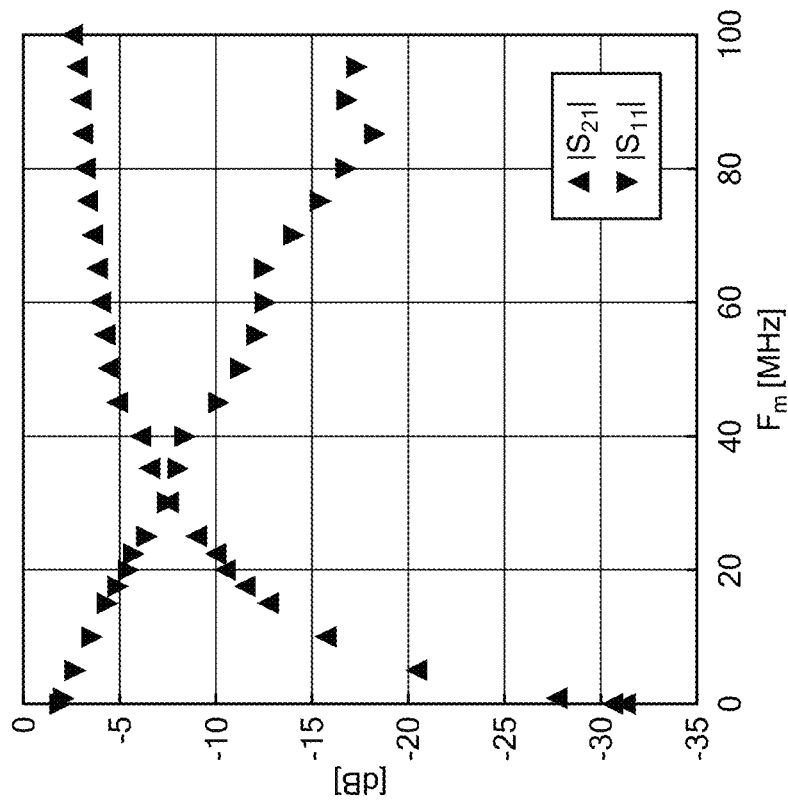
FIG. 16(d) reports $S_{11}$, $S_{21}$ values for various $F_m$, highlighting how the filter is reflective for low $F_m$ and low loss for higher $F_m$.
Figure 16C:
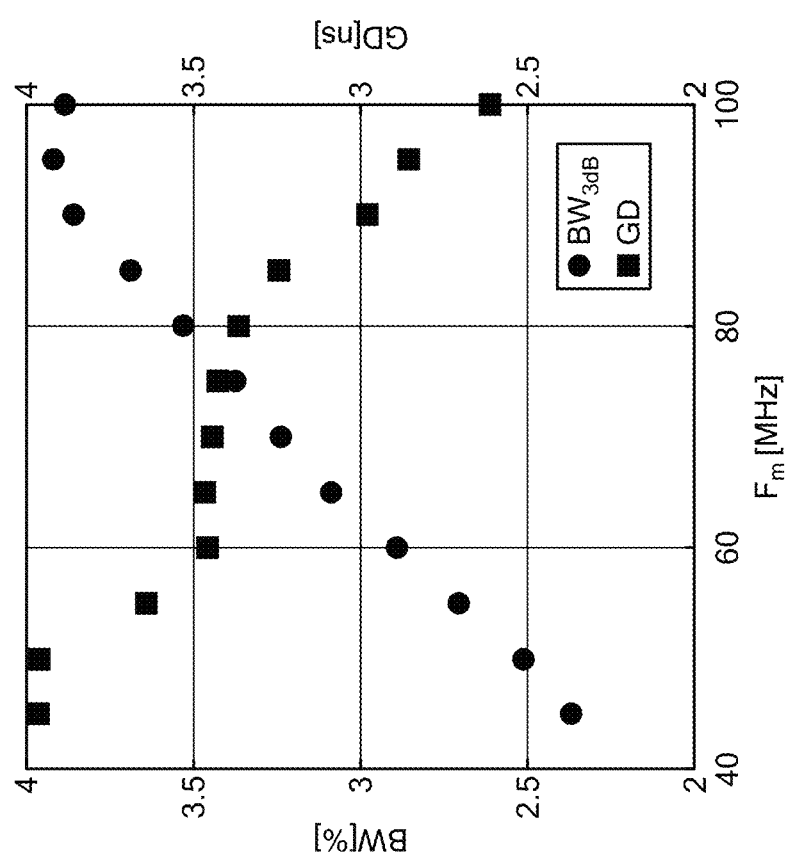

A small form-factor (1 mm by 1.5 mm) prototype was assembled on a custom FR4 PCB board (FIG. 15(a)). A Broadcom™ FBAR chip containing resonators operating at the same frequency were characterized (FIG. 15(b)) and bonded to the PCB. Finally, a single Qorvo™ double-pole-double-throw GaAs switch was driven by a 3 V-0 V single square wave with a duty cycle of 50% to realize the required modulation scheme shown in FIG. 12. Control signals were generated with a Tektronix AFG 3252C signal generator and tested with a Keysight N5221A Network Analyzer at room temperature and atmosphere. Up to 4% —3 dB FBW is measured at 2.72 GHz, with a minimum IL of 2.5 dB. More than 20 dB near-band OBR was predicted and measured with a single cell (FIG. 17).

Concerning the BS mode, it was obtained for $F_m \ll 1$ MHz and reported for $F_m=100$ kHz and showed a 30 dB notch at 2.7 GHz. Note that, when comparing the measurement with the simulation results for $F_m=80$ MHz (FIG. 17), good agreement was reported in-band, while out-of-band response was dominated by non-idealities such as switch parasitics and wirebonds. A single frequency power handling test was performed at the central frequency of the microsystem, resulting in linear response up to the compression point of the RF Amplifier used for the test ($\approx 30$ dBm). FIG. 16 illustrates measured S-parameters from the prototype illustrated in FIG. 15(a).

Thus, a microsystem for a reconfigurable RF MEMS filter has been demonstrated, with real-time reprogrammability of band-pass/band-stop response, as well as live reprogrammability of 3 dB BW in the band-pass state. Simulations showed that 50Ω matching can be achieved with smaller resonators than the ones needed in conventional ladder filter topologies. These features can provide reprogrammable front-ends, and some of the classic challenges of piezoelectric MEMS filters can be relaxed by using a simple circuit based on same resonance frequency resonators.

3.2 Further Experiments

To verify the properties connected to the time-modulated scheme introduced in this work, a simple testbench was designed and characterized starting entirely from off-the-shelf components. The device design was driven by the need of deploying commercially available as surface mounted devices (SMD), so resonators made of SMD inductor-capacitor tanks were selected and placed on a custom printed circuit board (PCB). The switch network was implemented starting from Qorvo™ engineering samples of Double Pole Double Throw RF switches already used in LTV designs.

Figure 10A:
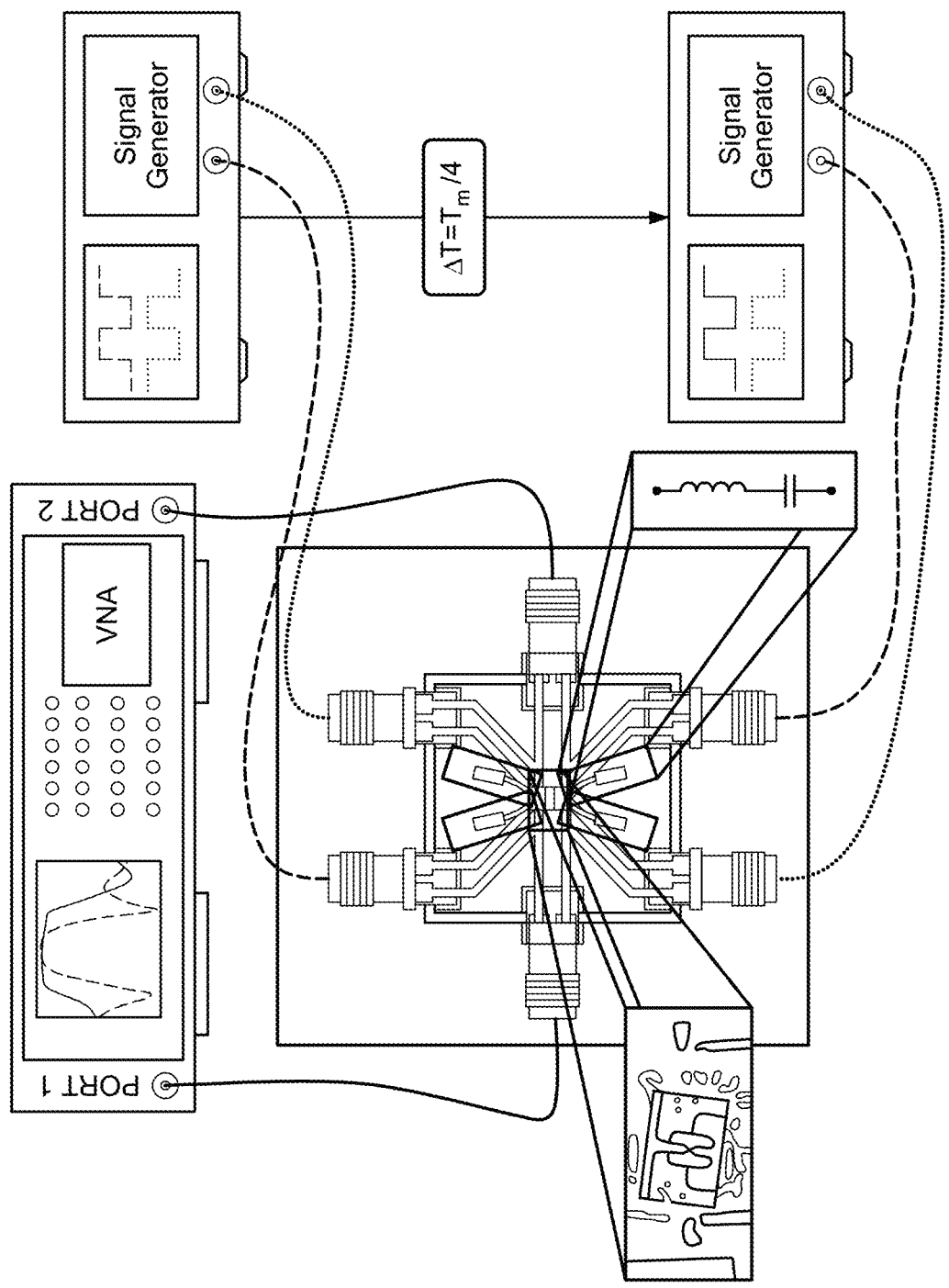
FIGS. 10(a)-10(e) illustrate experimental demonstration of a 100 MHz filter with 500% BW reconfigurability. The experimental setup (a), uses 2 DPDT Qorvo™ RF switches to commutate 4 identical LC resonators. The switches are driven by two signal generators providing quadrature signals at various modulation frequencies $f_m$. A 2-path response was induced and measured in (b), while a 4-path response was measured in (c). The measured responses (solid lines) for $f_m=25$ MHz to 45 MHz are well matched by circuit simulation (dashed line). For $f_m=45$ MHz, the out-of-band rejection degradation is due to finite risetimes, caused by off-chip signal generation. The designed prototype shows predicted BW tunability (e), altogether with low IL<2.5 dB and RL>20 dB (d).
Figure 10B:
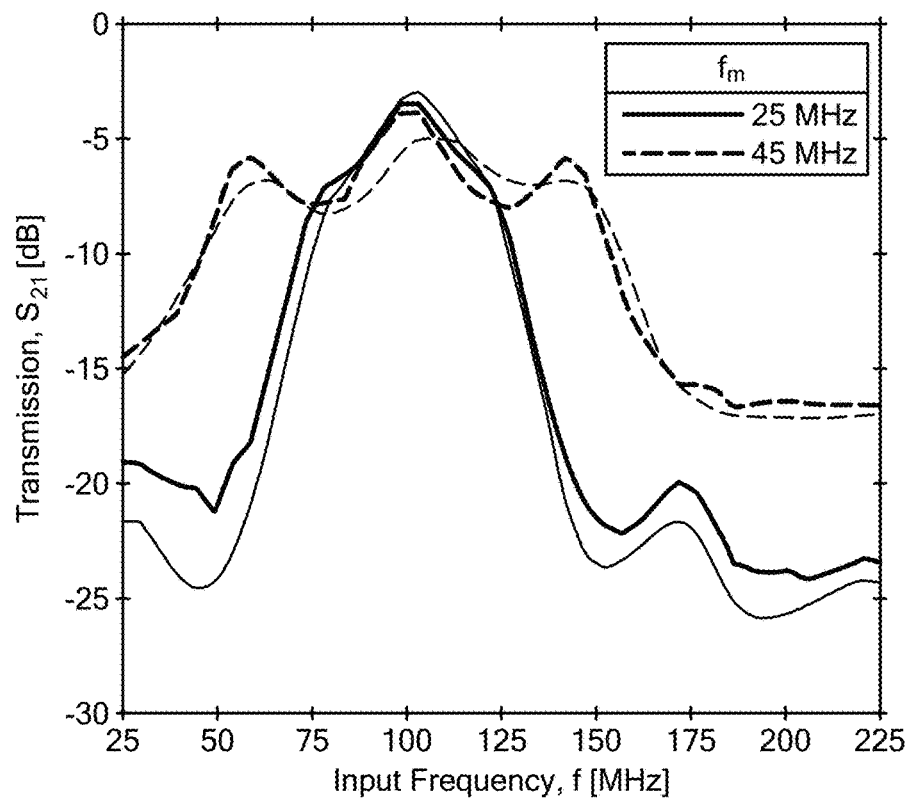
Figure 10C:
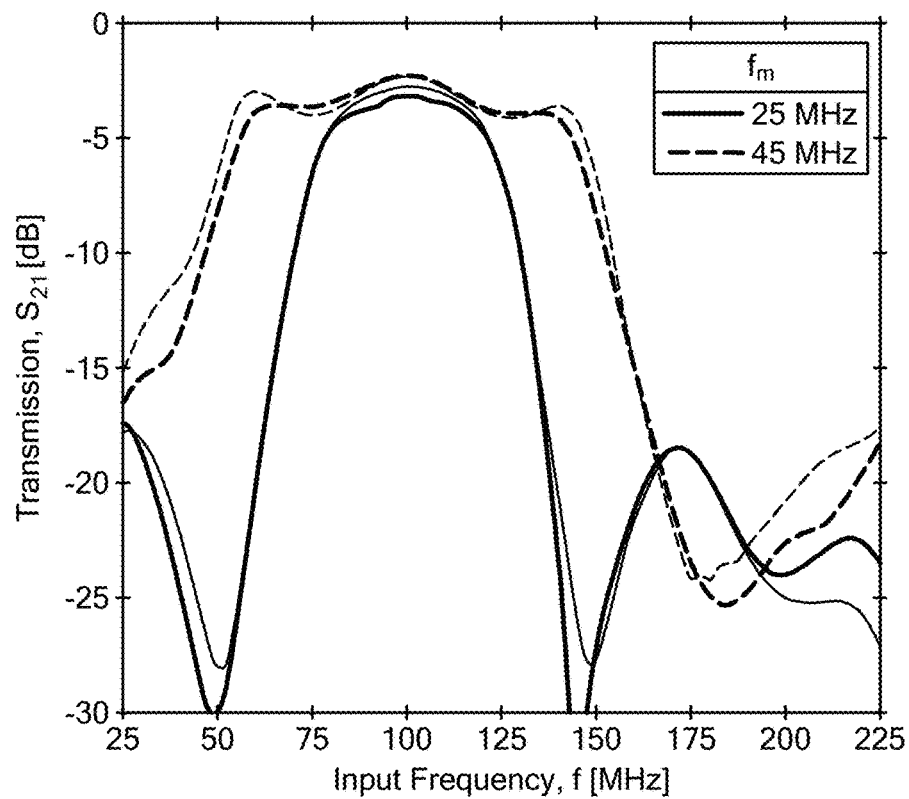

A target center frequency of 100 MHz was set for the PCB filter to avoid to compensate for PCB parasitics and to enable the use of off-chip control signals, limited by the laboratory setup to 50 MHz. With two quadrature driven DPDT switches it was possible both to induce two-paths response (FIG. 10(b)) and four-path response (FIG. 10(c)), respectively driving only a couple or two couples of switches. An illustration of the realized prototype is shown in FIG. 10(a).

The measurements confirmed simulation performances for both 2-path and 4-path responses. For the two-paths design, IL<2.5 dB was measured for $f_m=25$-45 MHz; however control signal rise-time degradation due to cable propagation and operation of the signal generators close to their maximum frequency (50 MHz) degraded out-of-band rejection from 20 to 15 dB as increasing $f_m$ from 25 to 45 MHz. Despite these nonidealities, the arising of modulation-induced TX poles is evident in FIG. 10(b) at the IM frequencies 100±45=145-55 MHz.

For the four-path design, IL<2.5 dB was measured for $f_m=25$ MHz to 45 MHz confirming that adding complexity to the simpler two-paths topology did not result in performance degradation. On the contrary, modulation-induced zeros at 100±2*25=50-150 MHz were confirmed by experimental evidence (in FIG. 10(c)) for $f_m=25$ MHz.

Figure 10D:
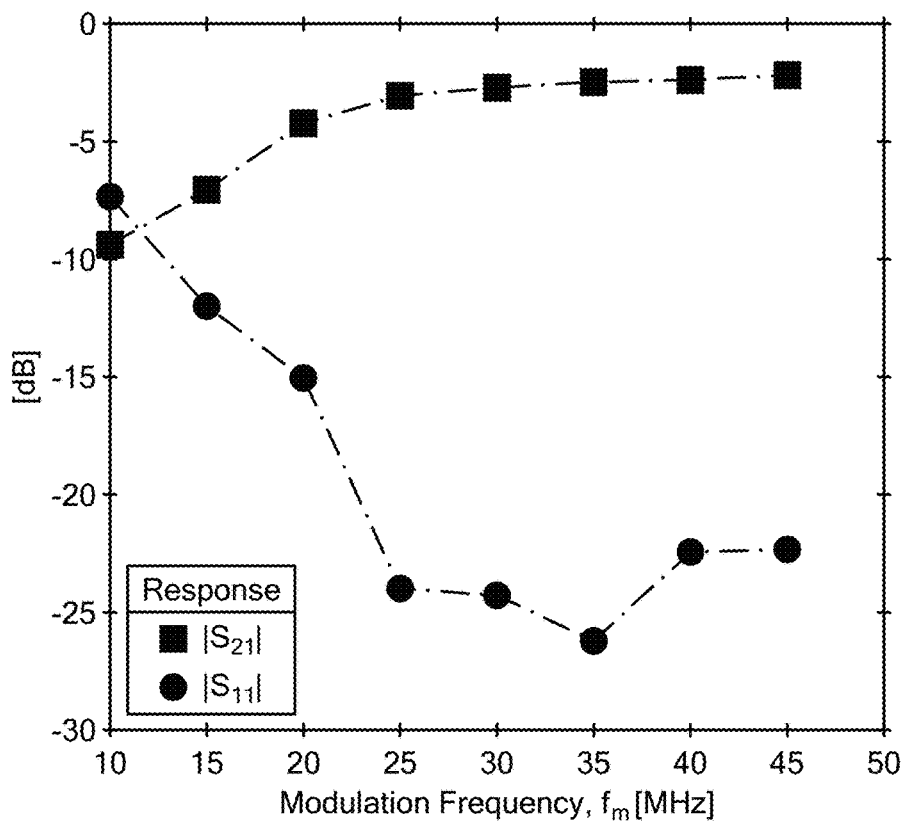

As predicted, the four-path topology showed excellent relative BW tunability ratio>5:1 within its 3 dB from the peak, when $f_m$ is swept from 10 MHz to 45 MHz. Correspondent values of IL and RL were provided at the filter center frequency 100 MHz in FIG. 10(d). Moreover, a bandstop to bandpass response transition when $f_m$ was changed is evident from the swept analysis in FIG. 10(d) for low $f_m$, as discussed in Sec. 2.

Figure 10E:
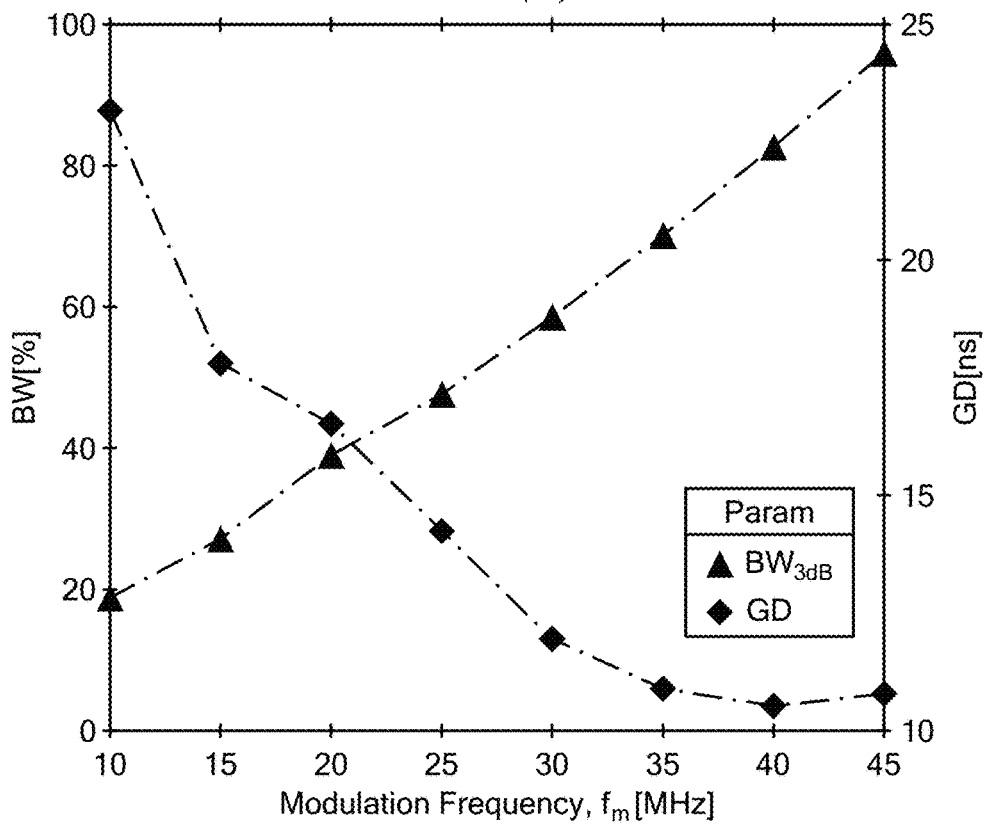

If a certain degree of error in control signals (±5%) is introduced for $f_m=45$ MHz excellent agreement between simulated and measured devices can be obtained. This correction revealed a system sensitivity to timing errors on the control signal side, however not impairing the experimental validation of large BW reconfigurability (FIG. 10(e)) and low losses (FIG. 10(d)). While these errors were very likely due to signal propagation from the generator to switches' gate, it is worth mentioning that, if the whole system were to be integrated in a small form factor adaptive filter with on-chip control signals, conventional timing calibration would ensure more precise clocking.

4. Conclusions

A simple, powerful and programmable solution for next generation RF filtering blocks has been introduced, modeled and experimentally shown. This filter architecture is capable of real-time reconfiguration of filter center frequency and bandwidth with a negligible overhead in terms of footprint and power consumption and does not require trimmed passive components.

This framework can lead to improved mobile RF front-end, as the channel selection can be entirely controlled by conventional digital circuitry, ultimately giving access to hardware reconfigurable filter to software-defined protocols in mobile radios, overcoming some of the challenges posed by conventional RF and microwave filter designs in the filtering stage of the RF chain.

A simple off-the-shelf RF implementation of the architecture was designed and tested, confirming the versatile manufacturability of these types of filters, which can obtain reconfiguration schemes without resorting to cutting-edge substrates or expensive process-dependent strategies.

As used herein, "consisting essentially of" allows the inclusion of materials or steps that do not materially affect the basic and novel characteristics of the claim. Any recitation herein of the term "comprising," particularly in a description of components of a composition or in a description of elements of a device, can be exchanged with "consisting essentially of" or "consisting of."

The present technology has been described in conjunction with certain preferred embodiments and aspects. It is to be understood that the technology is not limited to the exact details of construction, operation, exact materials or embodiments or aspects shown and described, and that various modifications, substitution of equivalents, alterations to the compositions, and other changes to the embodiments and aspects disclosed herein will be apparent to one of skill in the art.

What is claimed is:

1. A filter device comprising:
   a substrate, an electrical input port and an electrical output port supported on the substrate;
   at least two resonators having a same resonant frequency, the resonators connected on parallel paths between the input port and the output port; and
   a plurality of switch elements comprising, on each path, a pair of switches, a first switch of the pair connected between the input port and the resonator and a second switch of the pair connected between the resonator and the output port, the switches operable to be sequentially commutated at a modulation period and a duty cycle selected to provide a bandpass mode or a bandstop mode.

2. The filter device of claim 1, wherein the switch elements are operable, in the bandpass mode, to charge each of the resonators from the input port and discharge each of the resonators to the output port.

3. The filter device of claim 1, wherein the switch elements are operable in a pattern of overlapping charging times and overlapping discharging times, or in a pattern of non-overlapping charging times and a pattern of non-overlapping discharging times.

4. The filter device of claim 1, wherein the first switches are operable to turn on to charge the respective resonators from the input port, and after the first switch is turned off, the second switches are operable to turn on to discharge the respective resonators to the output port.

5. The filter device of claim 1, wherein, in the bandpass mode, an input signal from the input port is within a selected bandwidth of the resonant frequency, and in the bandstop mode, the input signal is outside of the selected bandwidth of the resonant frequency.

6. The filter device of claim 1, further comprising circuitry in communication with the plurality of switch elements to operate each of the switches at the selected modulation period and selected duty cycle.

7. The filter device of claim 1, wherein the switch elements are operable to reconfigure a center frequency of the filter device.

8. The filter device of claim 1, wherein each of the first switches is operable in an on state for a time proportional to a rise time of the resonators.

9. The filter device of claim 1, wherein the modulation period is proportional to a dominant time constant of the resonators, and the time constant is inversely proportional to the resonant frequency, a resonator capacitance, an electromechanical coupling coefficient of the resonators, and an impedance load at the input port.

10. The filter device of claim 1, wherein the duty cycle is selected based on a number of the resonators.

11. The filter device of claim 1, further comprising an inductor disposed in parallel with each of the resonators, and a further switch connected to the inductor and operable to turn the inductor on for operation in a bandstop mode.

12. The filter device of claim 1, wherein each resonator includes an electromechanical resonator or a resonant circuit.

13. The filter device of claim 12, wherein the resonant circuit includes a capacitor bank, back to back varactors, or reconfigurable resonators.

14. The filter device of claim 1, wherein each of the resonators comprises a thin-film piezoelectric resonator.

15. The filter device of claim 1, wherein each resonator comprises a piezoelectric layer, a first conductive material layer comprising at least a first electrode on a top surface of the piezoelectric layer, and a second conductive material layer comprising at least a second electrode on a bottom surface of the layer.

16. The filter device of claim 15, wherein the piezoelectric layer is a piezoelectric material selected from the group consisting of quartz, aluminum nitride, doped aluminum nitride, lithium niobate, lithium tantalite, zinc oxide, and gallium nitride.

17. The filter device of claim 1, wherein each switch element comprises a capacitor in parallel with a switch, an inductor in parallel with a switch, a single pole single throw switch, a single pole double throw switch, a double pole double throw switch, or a single pole N throw switch, where N is a number of the resonators.

18. A circuit device including a filter device, the filter device comprising:
   a substrate, an electrical input port and an electrical output port supported on the substrate;
   at least two resonators having a same resonant frequency, the resonators connected on parallel paths between the input port and the output port; and
   a plurality of switch elements comprising, on each path, a pair of switches, a first switch of the pair connected between the input port and the resonator and a second switch of the pair connected between the resonator and the output port, the switches operable to be sequentially commutated at a modulation period and a duty cycle selected to provide a bandpass mode or a bandstop mode.

19. The circuit device of claim 18, further comprising a control unit in communication with the filter device, the control unit comprising a voltage controller or a digital decoder.

20. A method of operating a filter device,
   the filter device comprising:
   a substrate, an electrical input port and an electrical output port supported on the substrate;
   at least two resonators having a same resonant frequency, the resonators connected on parallel paths between the input port and the output port; and
   a plurality of switch elements comprising, on each path, a pair of switches, a first switch of the pair connected between the input port and the resonator and a second switch of the pair connected between the resonator and the output port, the switches operable to be sequentially commutated at a modulation period and a duty cycle selected to provide a bandpass mode or a bandstop mode;

the method comprising operating the switch elements to actuate the resonators over time in the bandpass mode or the bandstop mode.

\* \* \* \* \*